(12) United States Patent
Dutta

(10) Patent No.: US 7,535,033 B2
(45) Date of Patent: May 19, 2009

(54) MULTICOLOR PHOTODIODE ARRAY AND METHOD OF MANUFACTURING

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 11/162,523

(22) Filed: Sep. 13, 2005

(65) Prior Publication Data

US 2006/0081768 A1   Apr. 20, 2006

Related U.S. Application Data

(60) Provisional application No. 60/522,311, filed on Sep. 14, 2004.

(51) Int. Cl.
*H01L 27/146* (2006.01)
(52) U.S. Cl. .............................. 257/184; 257/458
(58) Field of Classification Search .................. None
See application file for complete search history.

(56) References Cited

U.S. PATENT DOCUMENTS

| | | | | |
|---|---|---|---|---|
| 4,814,847 A | * | 3/1989 | Tabatabaie | 257/186 |
| 5,040,039 A | * | 8/1991 | Hattori et al. | 257/463 |
| 5,387,796 A | * | 2/1995 | Joshi et al. | 250/370.12 |
| 5,518,934 A | * | 5/1996 | Forrest et al. | 438/73 |
| 5,600,130 A | * | 2/1997 | VanZeghbroeck | 250/214.1 |
| 5,654,578 A | * | 8/1997 | Watanabe | 257/438 |
| 6,620,642 B2 | * | 9/2003 | Dudoff et al. | 438/26 |
| 2002/0033491 A1 | * | 3/2002 | Kuhara et al. | 257/227 |
| 2002/0109147 A1 | * | 8/2002 | Shirai et al. | 257/93 |
| 2002/0113282 A1 | * | 8/2002 | Yoneda et al. | 257/436 |
| 2003/0178636 A1 | * | 9/2003 | Kwan et al. | 257/186 |
| 2004/0135224 A1 | * | 7/2004 | Bui et al. | 257/461 |

* cited by examiner

*Primary Examiner*—Evan Pert
*Assistant Examiner*—Ben P Sandvik

(57) ABSTRACT

Novel structures of the photodetector having broad spectral ranges detection capability are provided. The photodetector can offer high quantum efficiency >95% over wide spectral ranges, high frequency response >10 GHz (@3 dB). The photodiode array of N×N elements is also provided. The array can also offer wide spectral detection ranges ultraviolet to 2500 nm with high quantum efficiency >95% and high quantum efficiency of >10 GHz, cross-talk of <1%. In the array, each photodiode can be independently addressable and can be made either as top-illuminated or as bottom illuminated type detector. The photodiode and its array provided in this invention, could be used in multiple purpose applications such as telecommunication, imaging and sensing applications including surveillance, satellite tracking, advanced lidar systems, etc. The advantages of this photodetectors are that they are uncooled and performance will not be degraded under wide range of temperature variation.

2 Claims, 28 Drawing Sheets

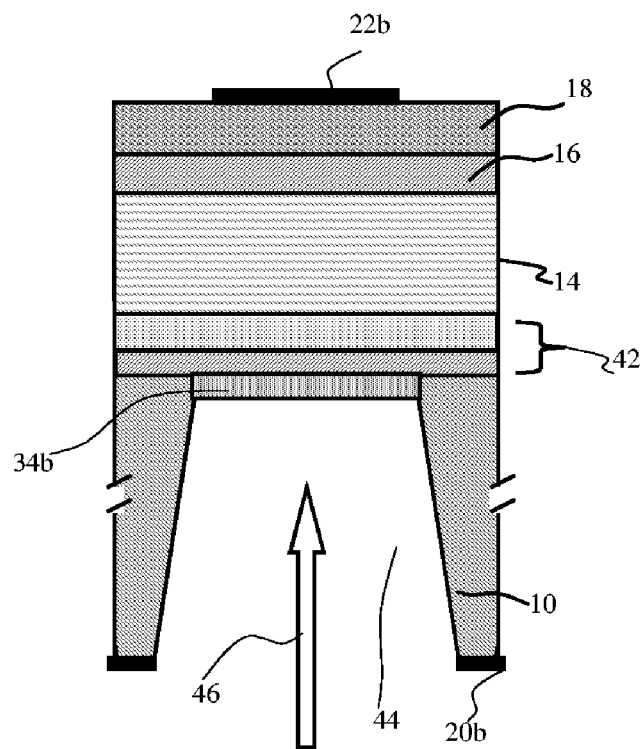
FIG. 7A (0.3 to 1.7 μm)
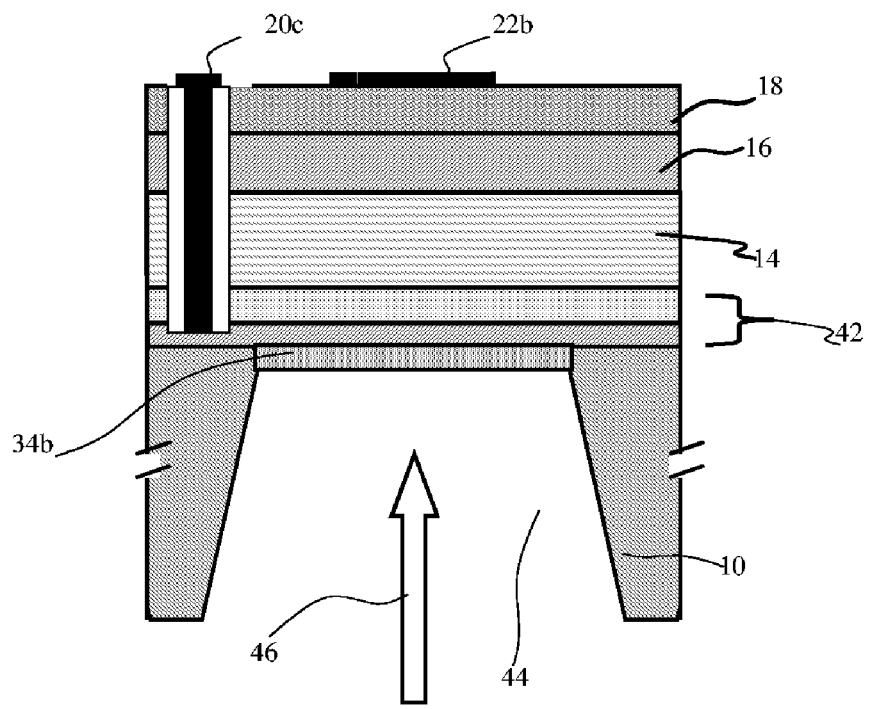
FIG. 7B (0.3 to 1.7 μm)

FIG. 8 (0.3 to 2.5 μm)

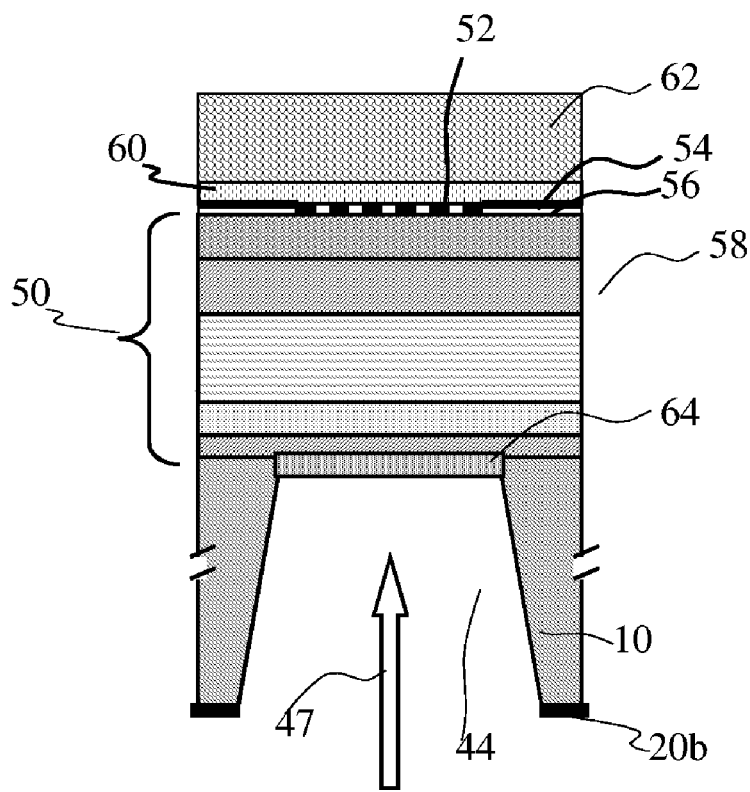
FIG. 9A
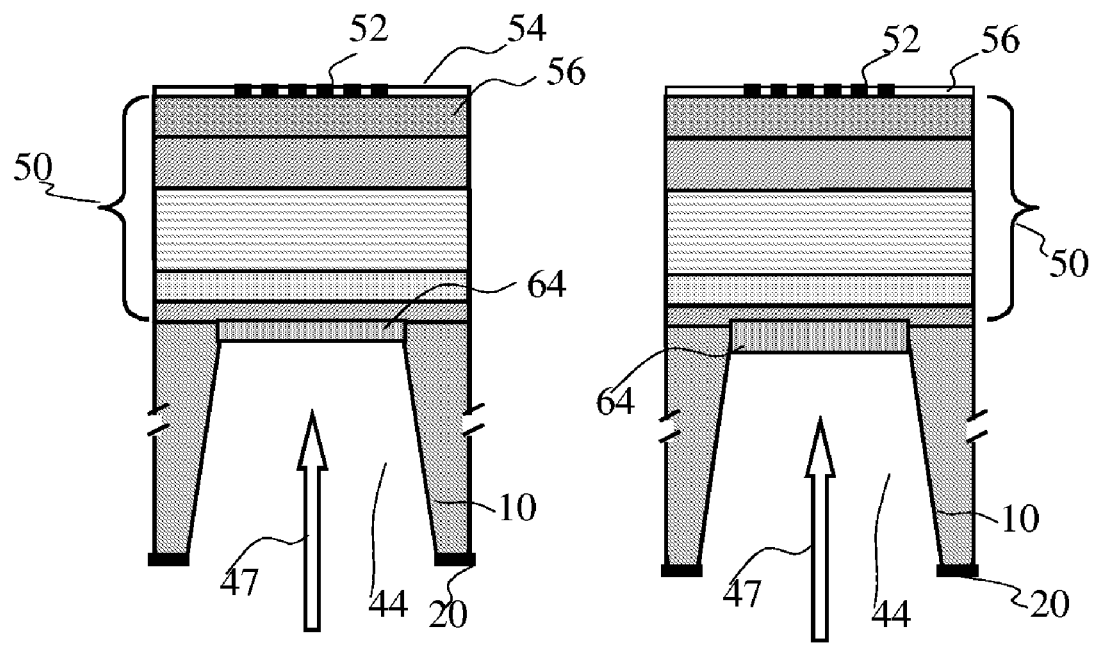
FIG. 9B  FIG. 9C

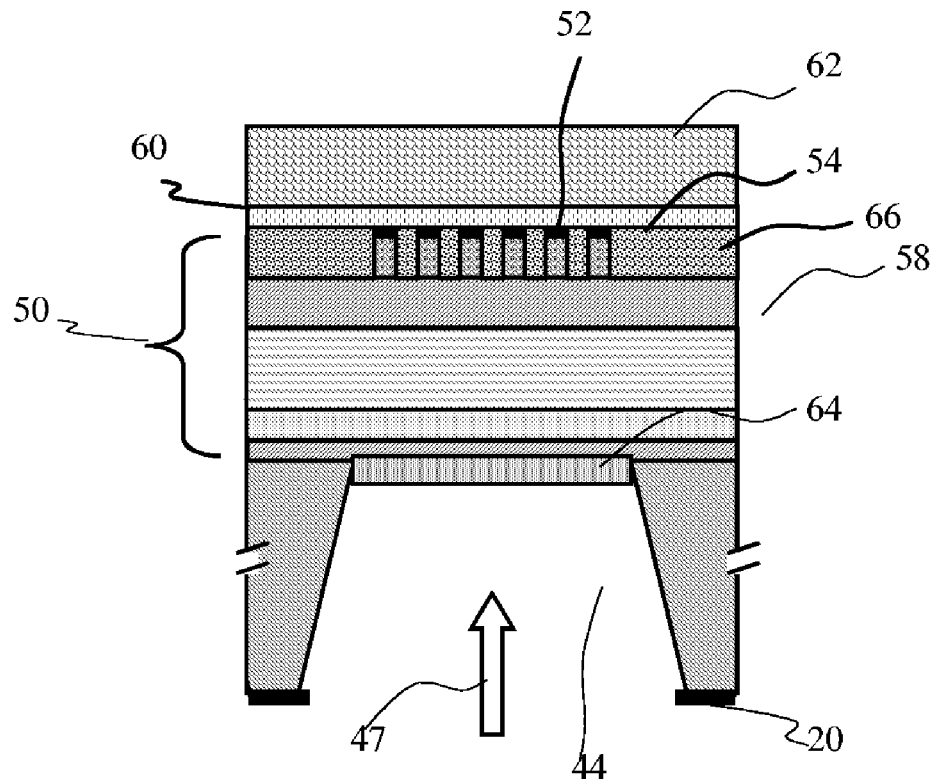
FIG. 10A
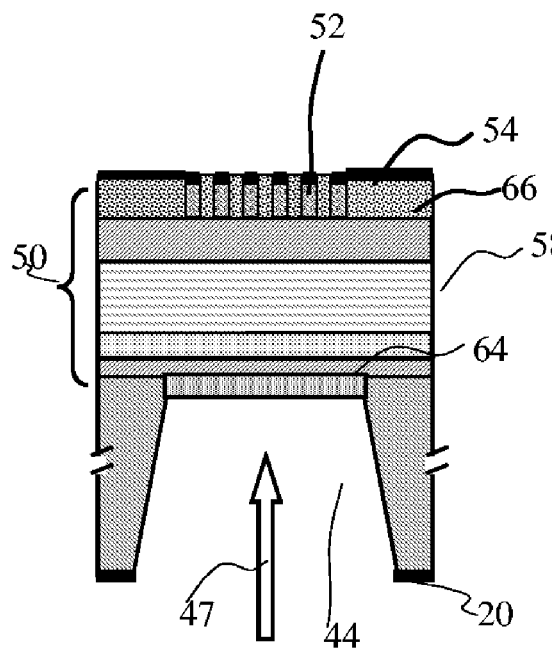 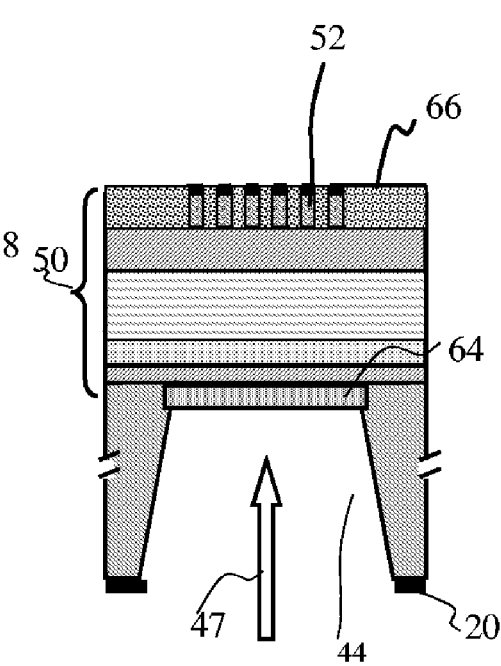
FIG. 10B  FIG. 10C

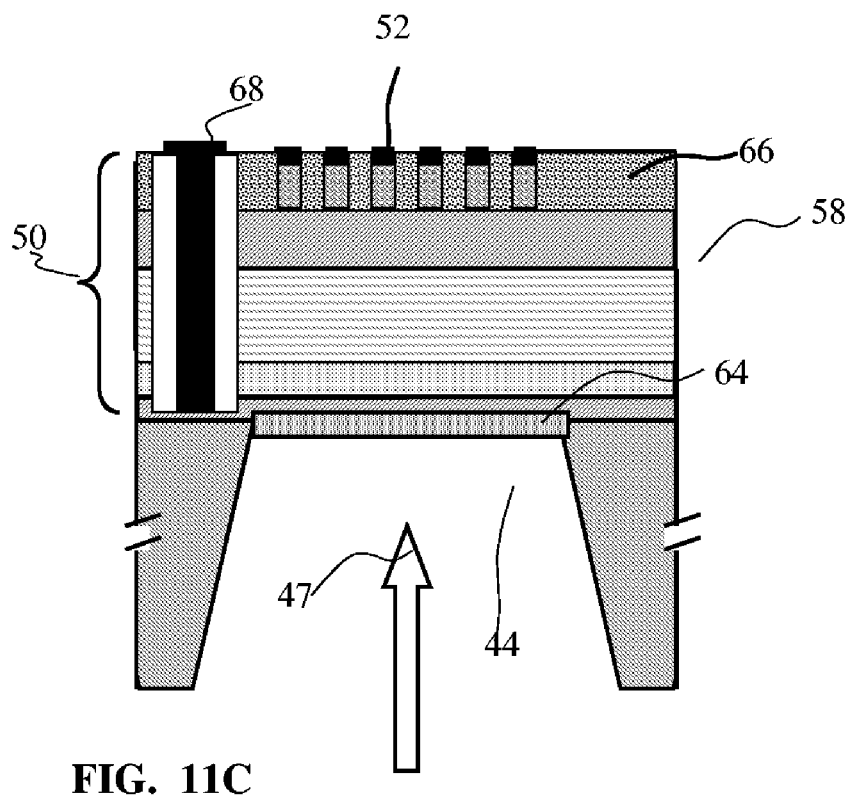
FIG. 11C
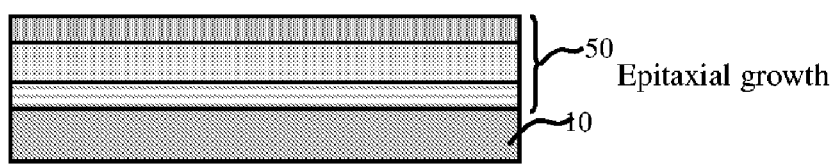
FIG. 12A — Epitaxial growth
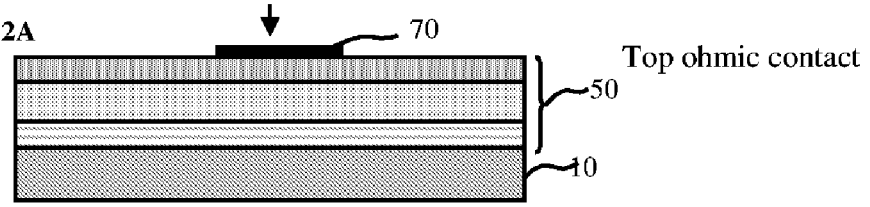
FIG. 12B — Top ohmic contact
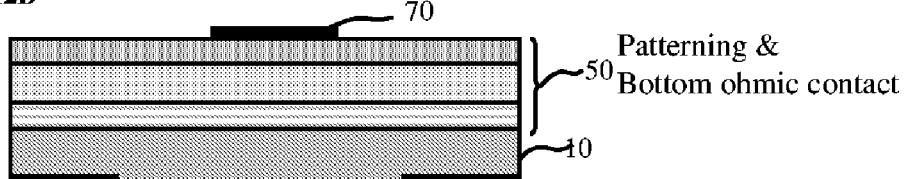
FIG. 12C — Patterning & Bottom ohmic contact

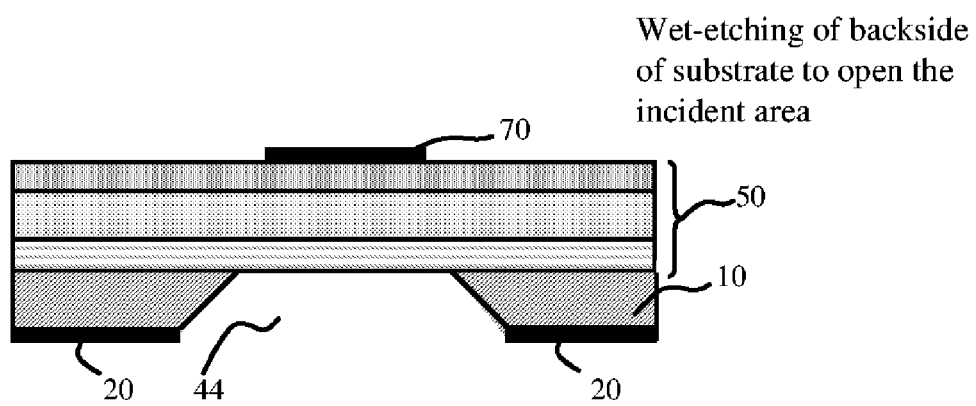
FIG. 12D
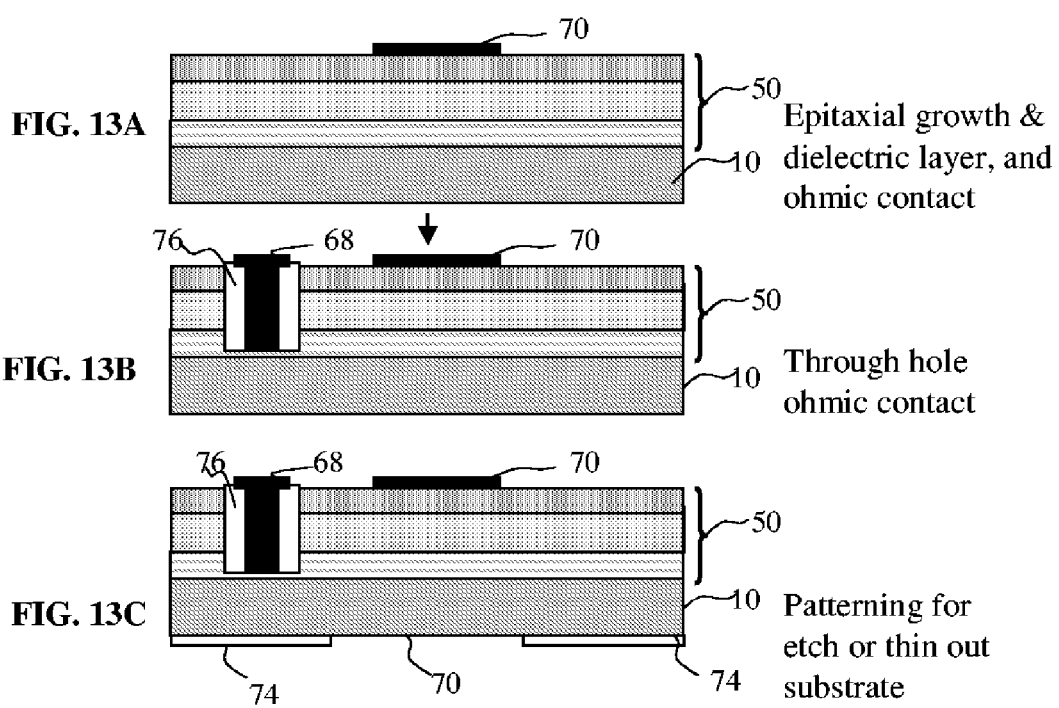
FIG. 13A — Epitaxial growth & dielectric layer, and ohmic contact
FIG. 13B — Through hole ohmic contact
FIG. 13C — Patterning for etch or thin out substrate

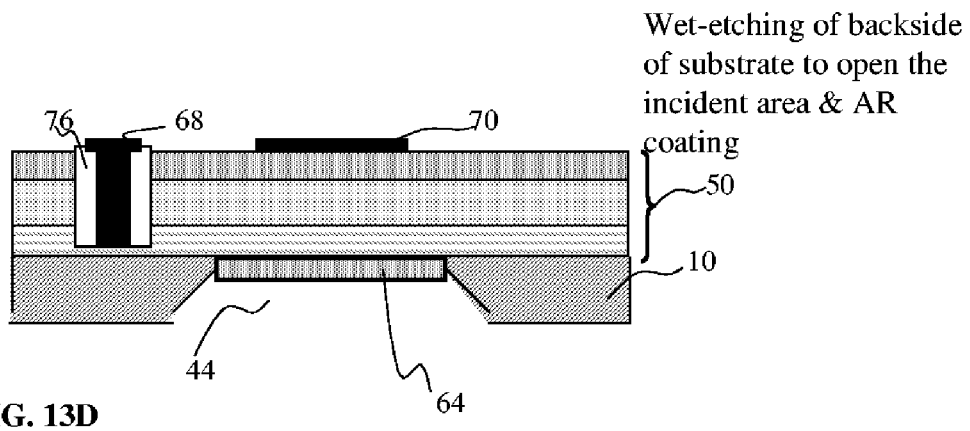
FIG. 13D
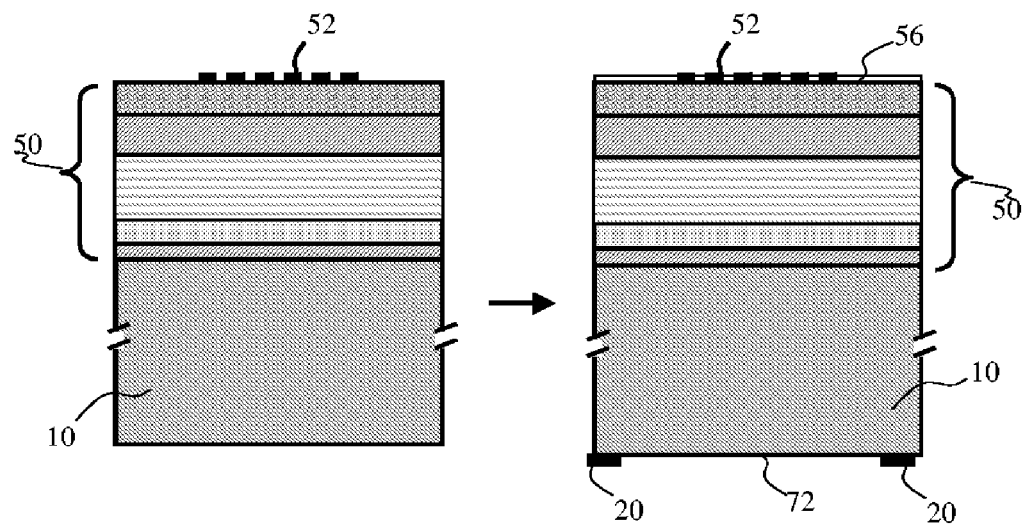
FIG. 14A  FIG. 14B

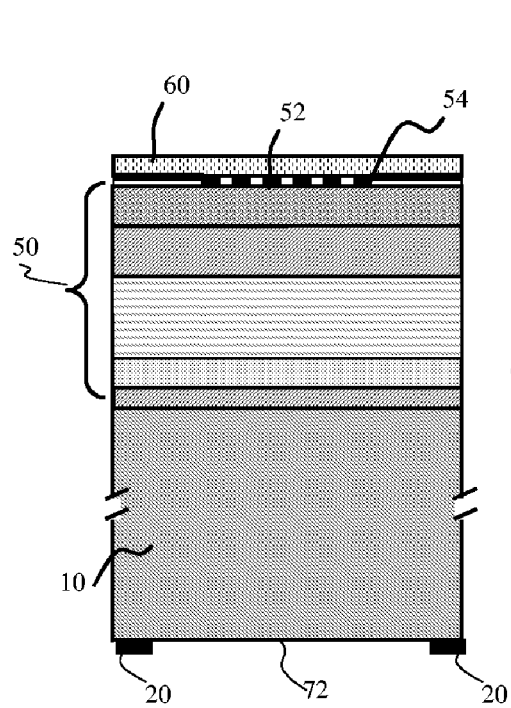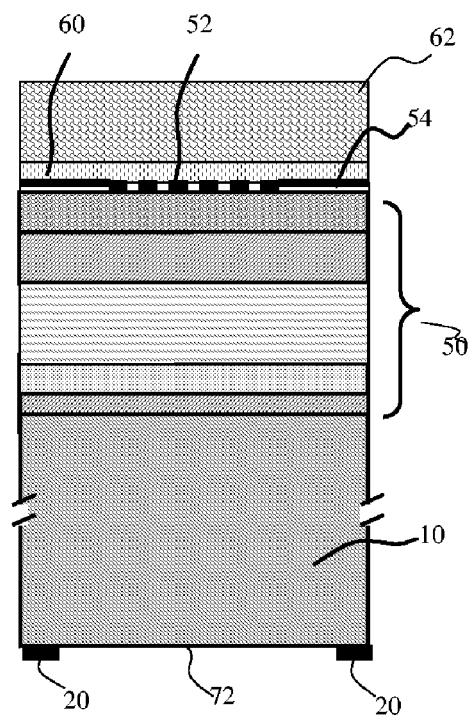
FIG. 14C          FIG. 14D
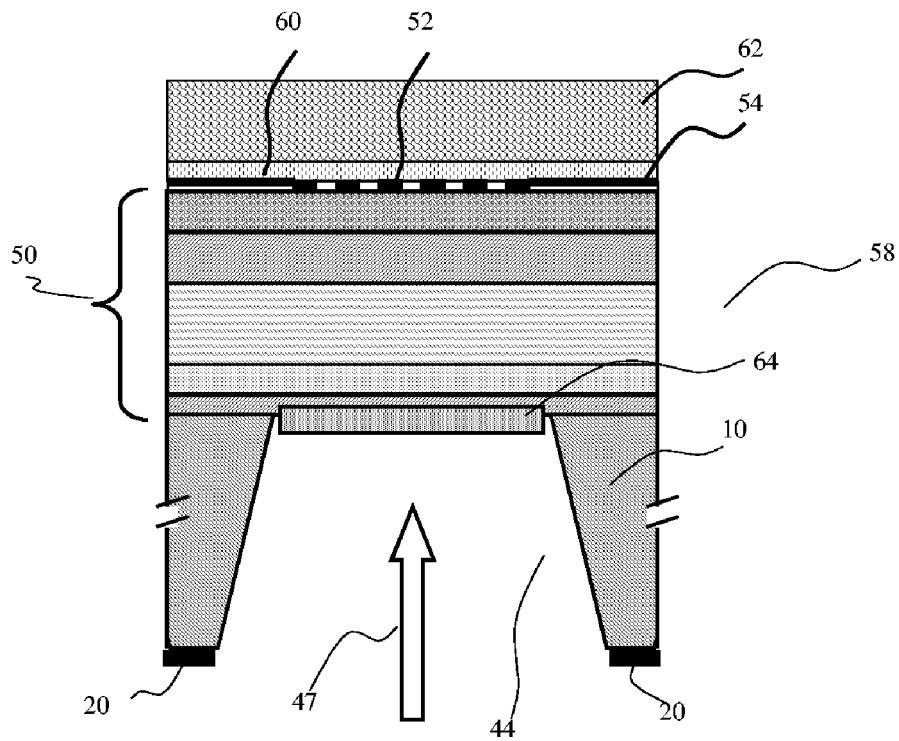
FIG. 14E

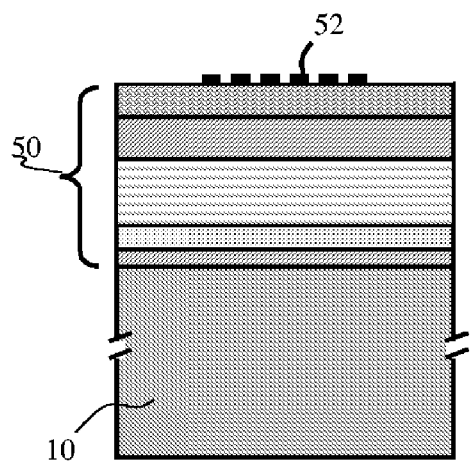
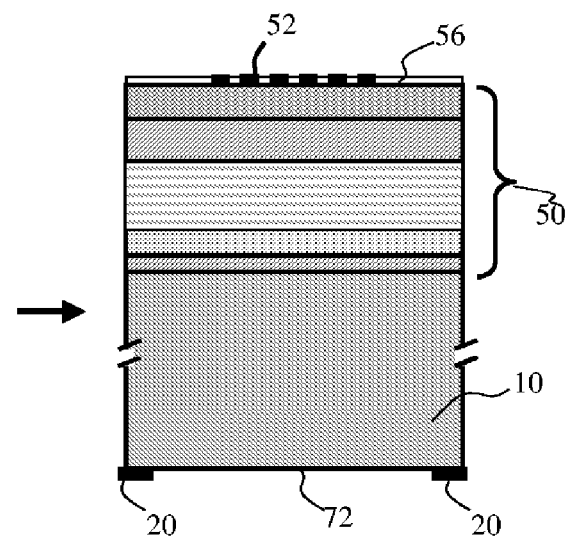
FIG. 15A    FIG. 15B
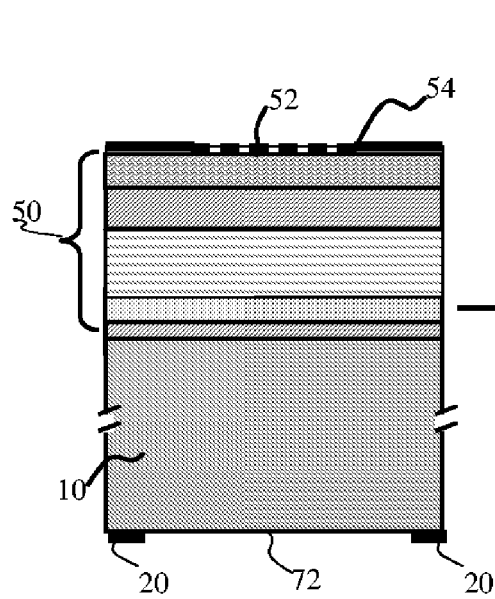
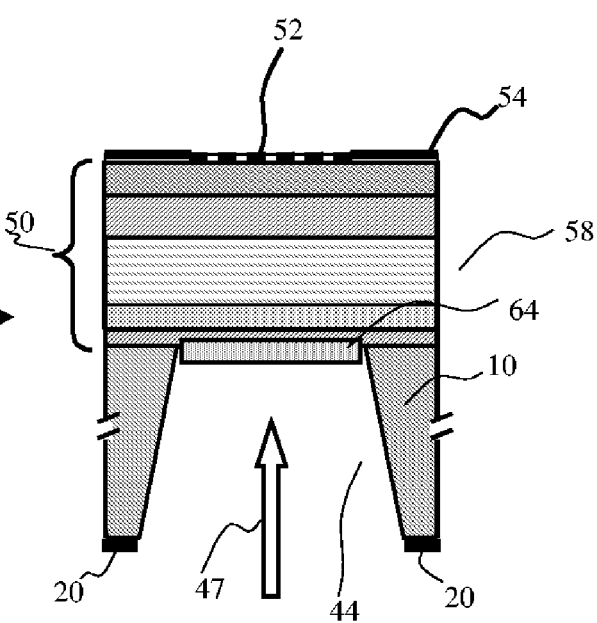
FIG. 15C    FIG. 15D

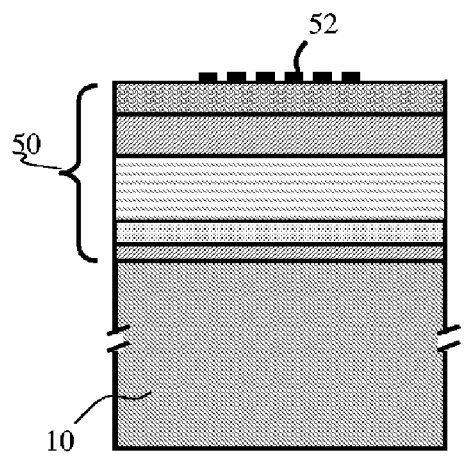
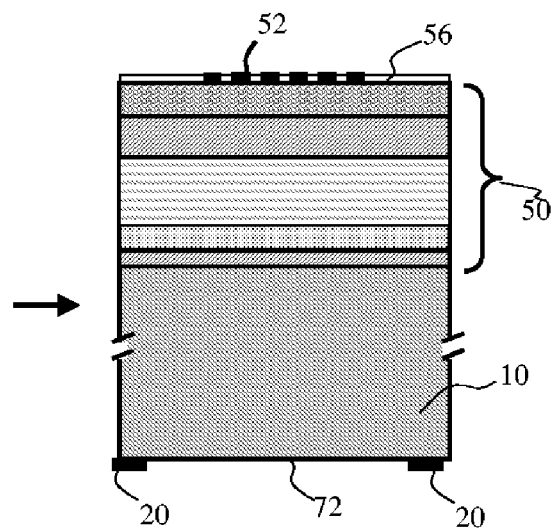
FIG. 16A        FIG. 16B
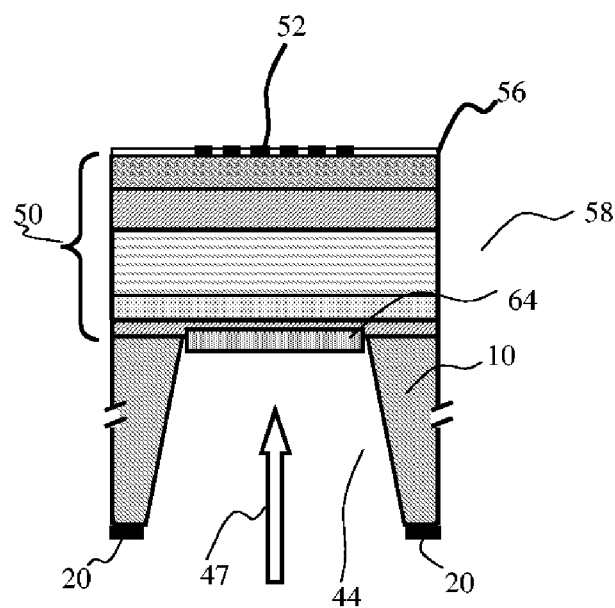
FIG. 16C

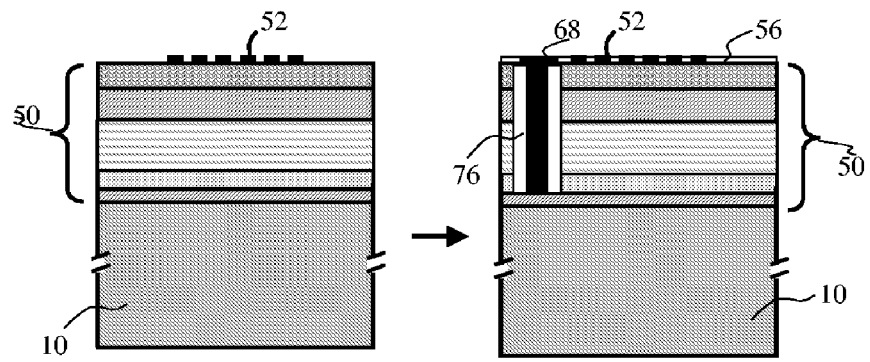
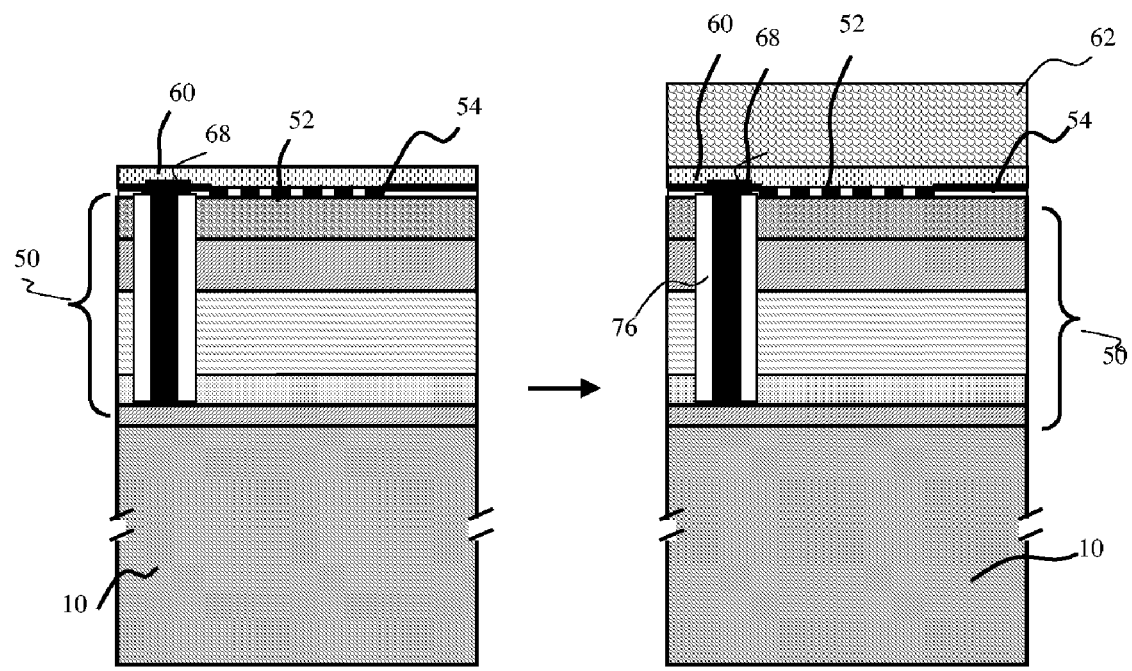
FIG. 17A  FIG. 17B
FIG. 17C  FIG. 17D

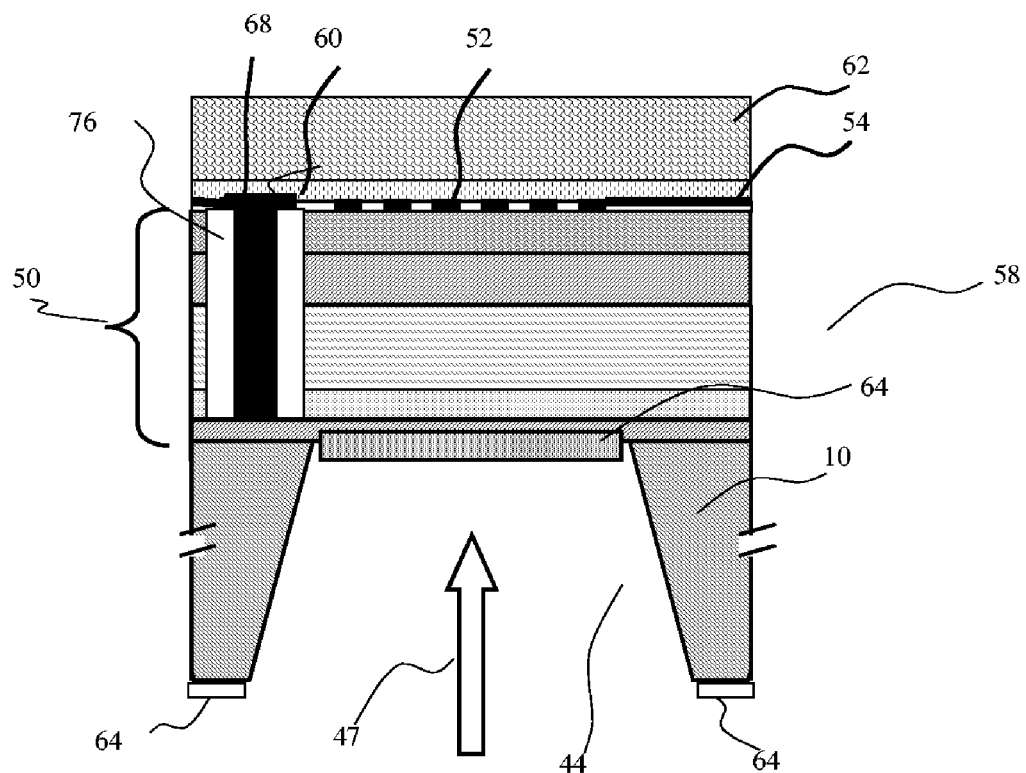
FIG. 17E
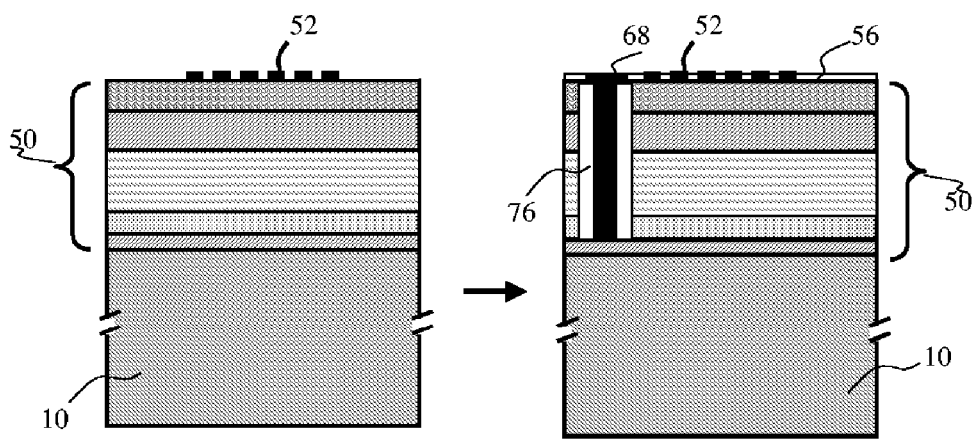
FIG. 18A  FIG. 18B

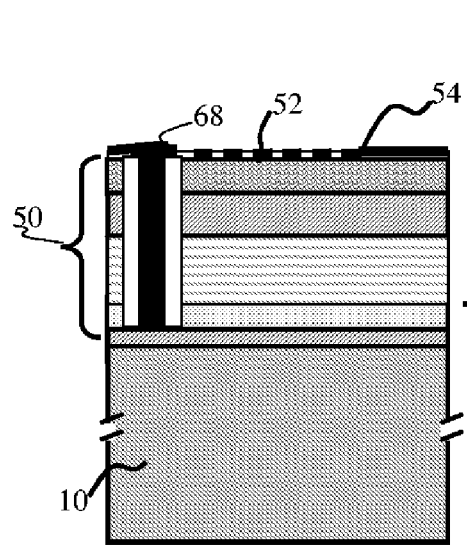
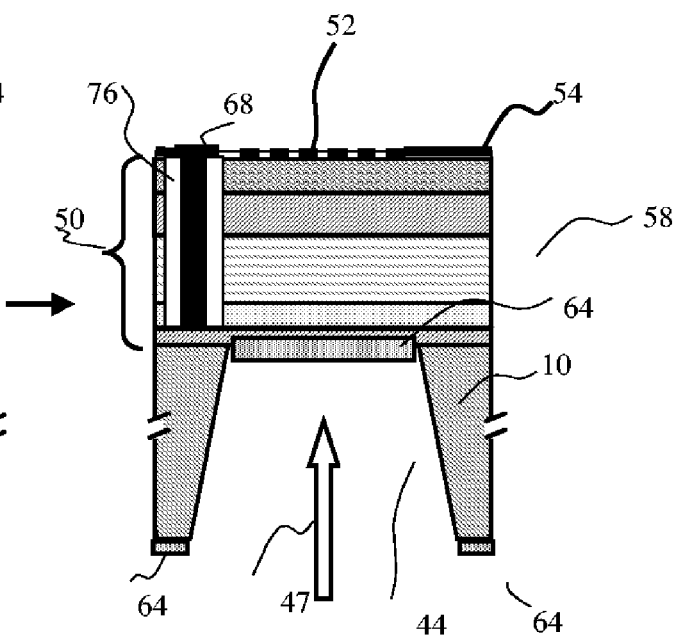
FIG. 18C     FIG. 18D
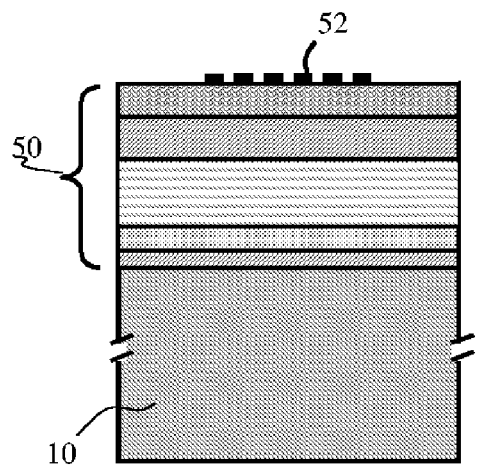
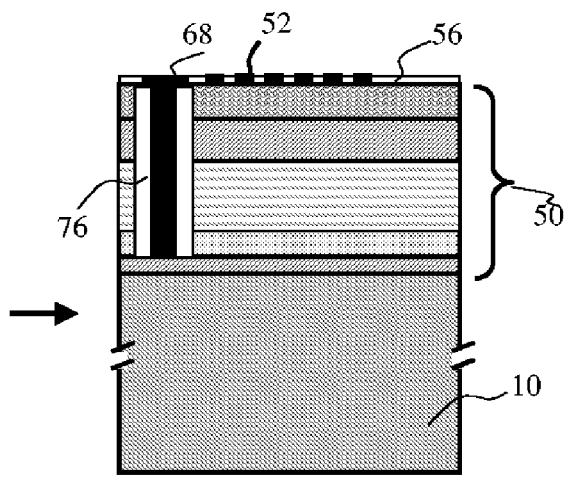
FIG. 19A     FIG. 19B

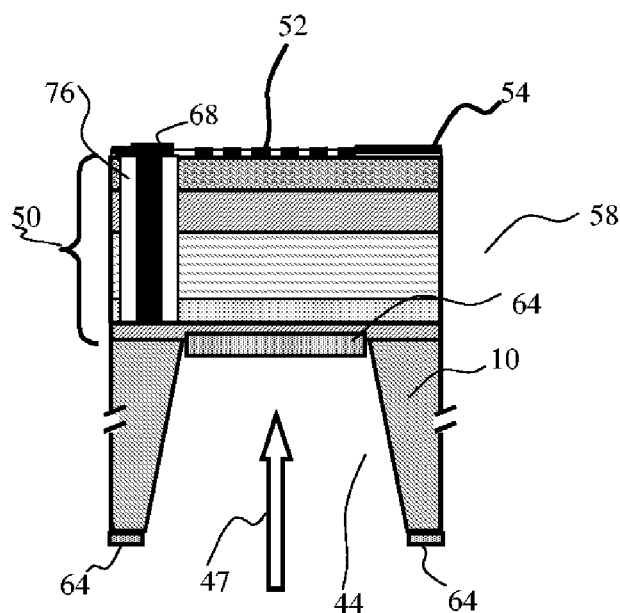
FIG. 19C
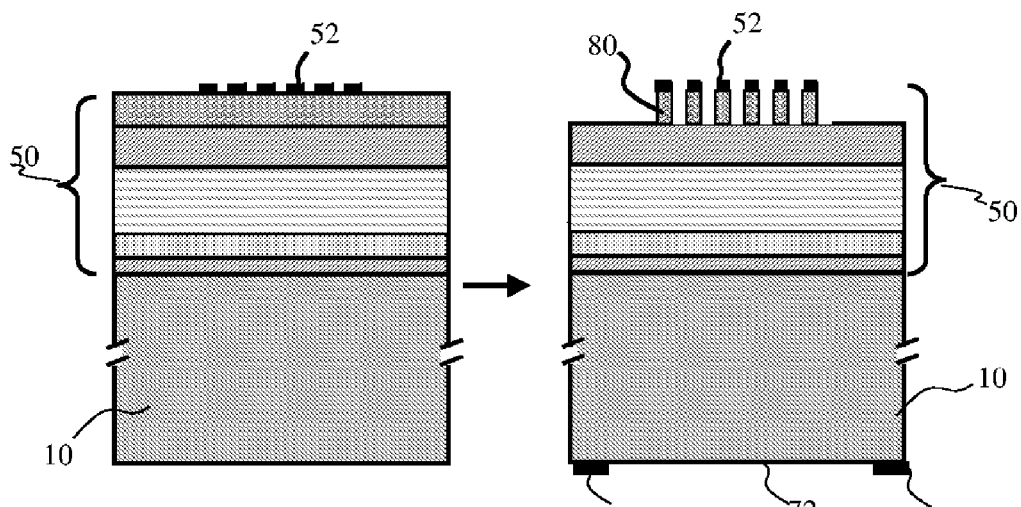
FIG. 20A  FIG. 20B

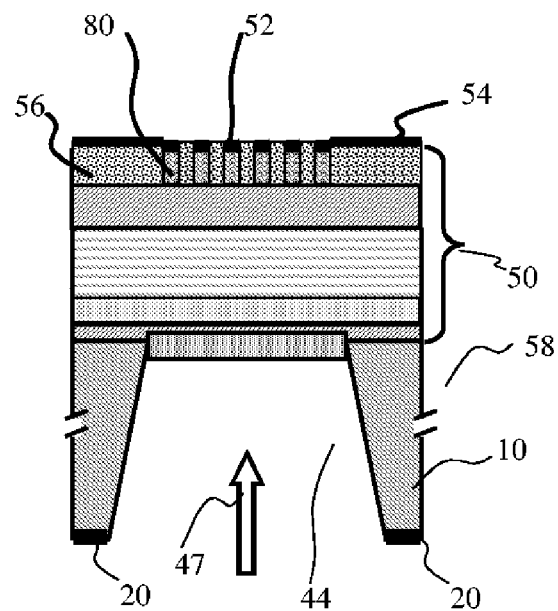
FIG. 21E
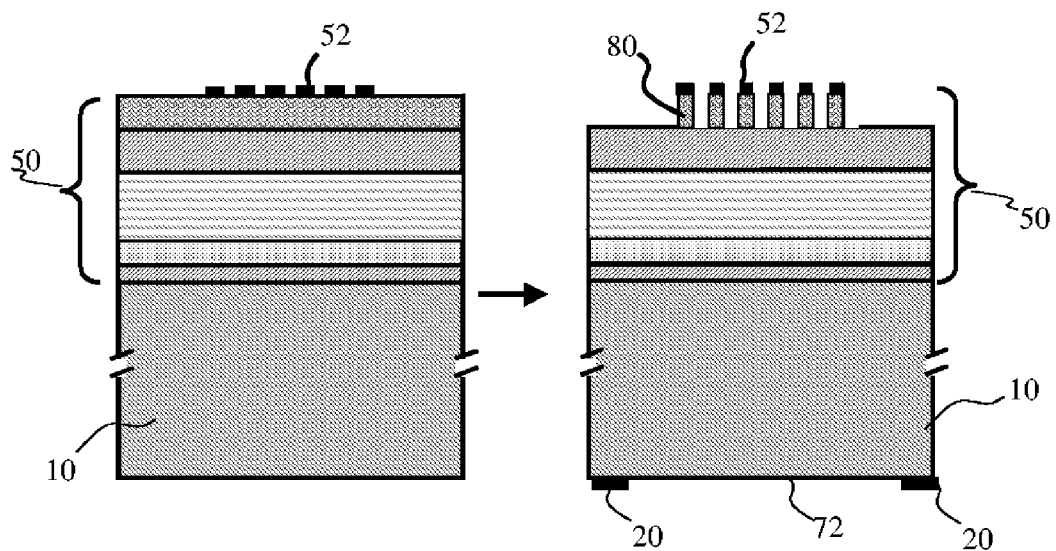
FIG. 22A  FIG. 22B

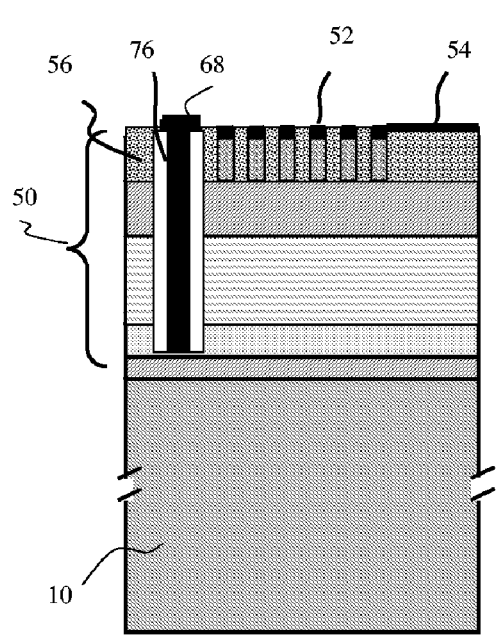
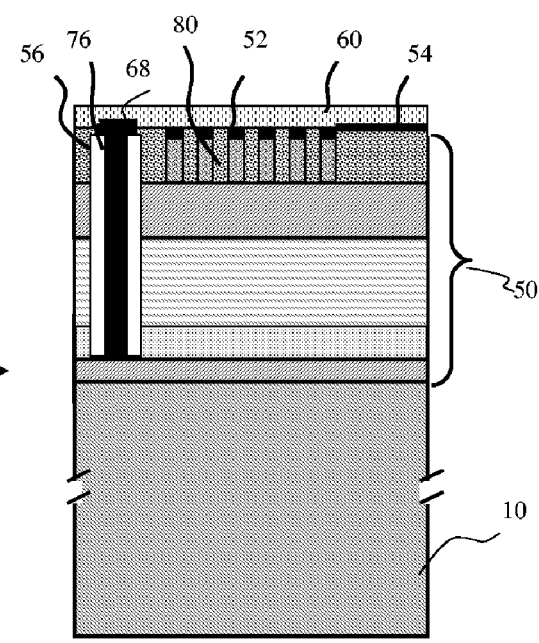
FIG. 23C     FIG. 23D
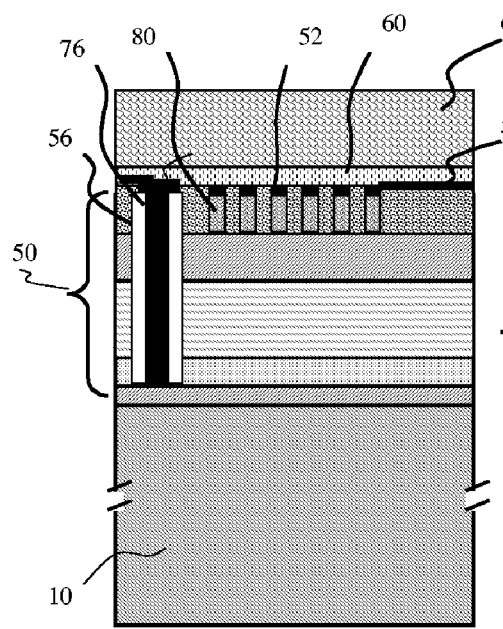
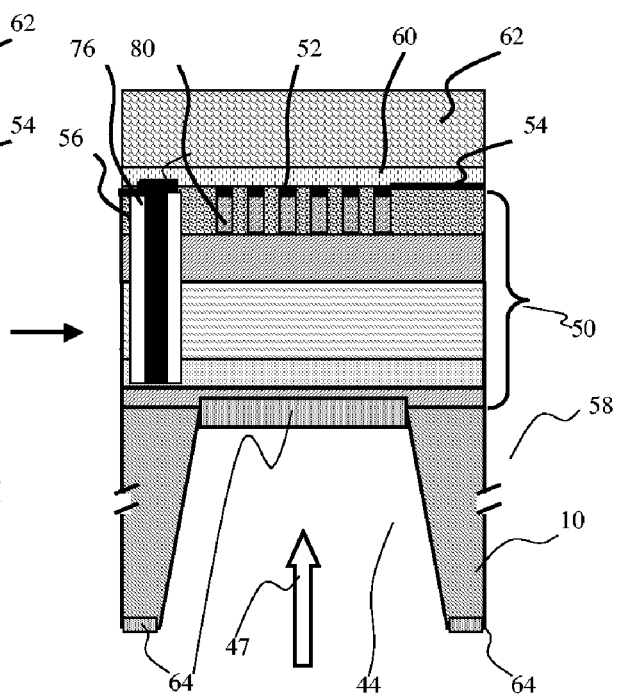
FIG. 23E     FIG. 23F

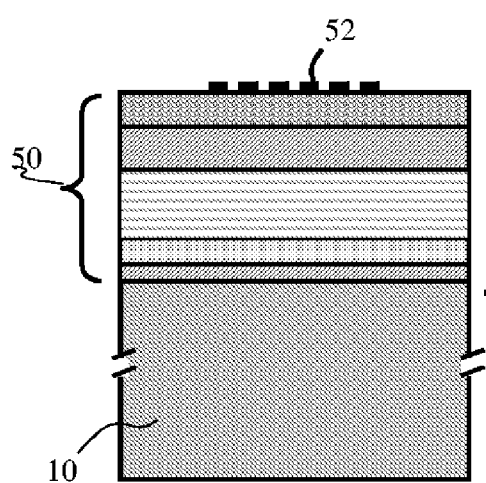
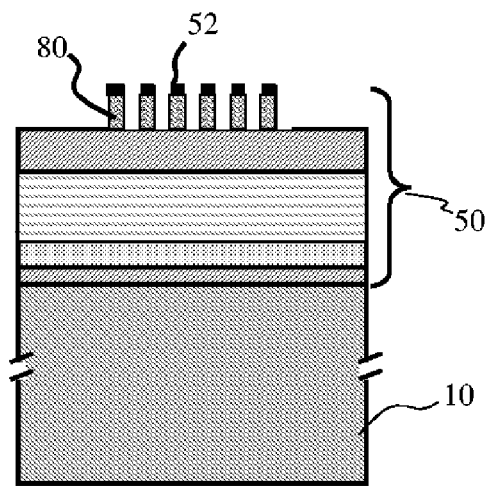
FIG. 24A  FIG. 24B
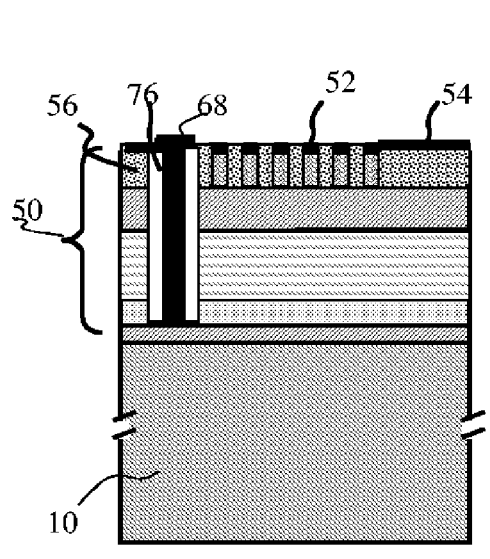
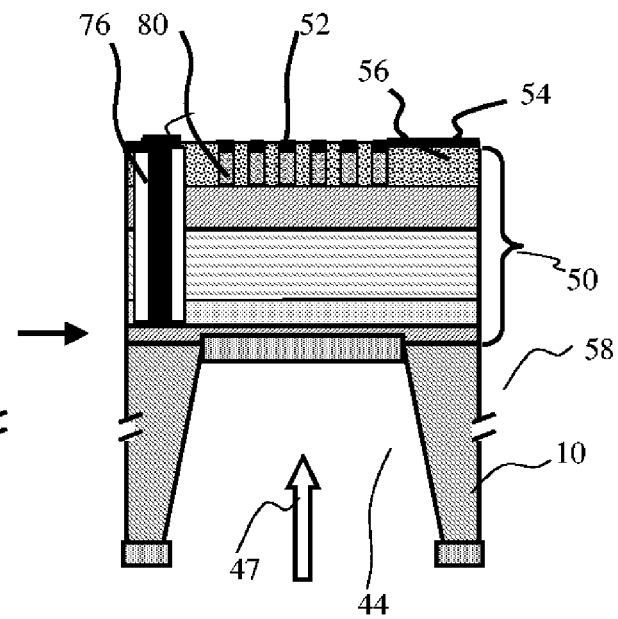
FIG. 24C  FIG. 24D

MULTICOLOR PHOTODIODE ARRAY AND METHOD OF MANUFACTURING

CROSS REFERENCE TO RELATED APPLICATIONS

This application claims the benefit of U.S. Provisional Patent Application No. 60/522,311 filed on Sep. 14, 2004.

FIELD OF THE INVENTION

This invention relates to optical detector having broad spectral detection covering the wavelengths from ultra-violet (UV) to near infrared (1700 nm and also up to 2500 nm). More particularly, this invention is related to the multicolor detector, which can detect the light wavelengths ranges from as low as UV to the wavelengths as high as 1700 nm covering the most of the communication wavelength, and also from UV to as high as 2500 nm using of the single monolithic detector fabricated on the single wafer. This invention is also related to the multispectral photodetector arrays for multicolor imaging, sensing, and advanced communication.

BACKGROUND OF THE INVENTION

Solid-state imaging devices with higher resolution are used in many commercial applications especially camera and also for other light imaging uses. Such imaging devices typically comprise of CCD (charge coupled device) photo detector arrays with associated switching elements, and address (scan) and read out (data) lines. This CCD technology is matured so much that now days a million of pixels and surrounding circuitry can be fabricated using the CMOS (complimentary metal oxide semiconductor) technology. As todays CCD technology is based on silicon (Si)-technology, the detectable spectral ranges of CCD are limited to the wavelengths below 1 μm where Si exhibits absorption. Besides, CCD based imaging technique has also other shortcomings such as high efficiency response combined with high quantum efficiency over broad spectral ranges. This broad spectral detection is required in many applications. One of them is the free space laser communication where shorter (in visible ranges) and near infrared wavelengths is expected to be used. Photodiode array having broad spectral detection capability, disclosed in this invention, is expected to provide those features not available in today's CCD technology. With well designed of the array, appreciable resolution can also be achieved in photodiode array technology.

Photodiodes especially of p-i-n type have been studied extensively over the last decade for its application in optical communication. These photodiodes are for near infrared detection, especially the wavelength vicinity to 1310 and 1550 nm, where today's optical communication is dealt with. Now a day, the photodetector speed as high as 40 Gb/s, as described in the publication by Dutta et. al. in *IEEE Journal of Lightwave Technology*, vol. 20, pp. 2229-2238 (2002) is achieved. Photodetector having a quantum efficiency as close to 1, as described in the publication by Emsley et. al., in the *IEEE J. Selective Topics in Quantum Electronics*, vol. 8(4), pp. 948-955 (2002), is also available for optical communication. These photodiode uses InGaAs material as absorption material, and the diode is fabricated on the InP wafer. On the other hand, Si substrate is used for the photodiode for detection of visible radiation.

For covering broad spectral ranges, two photodiodes fabricated from Si and InP technology and discretely integrated, can be used. Monolithically, wafer bonding technology to bond Si and InP can be used to fabricated the photodiode covering the wavelengths from visible to near infrared. However, the reliability of wafer bonding over wide range of temperature is still an unsolved issue and a high-speed operation is not feasible with a wafer bonding approach. It is highly desirable to have a monolithic photodiode array, which could offer high bandwidth (GHz and above) combined with high quantum efficiency over a broad spectral ranges (<300 nm to 1700 nm and also to <300 nm to 2500 nm). For using especially in imaging purpose where CCD or Si based image sensor based device are used, the multicolor photodiode array with the possibility to rapidly and randomly address any pixel is also very much essential.

It is our objective to develop a monolithic photodiode array for broad spectral ranges covering from <300 nm to 1700 nm wavelength detection with having frequency response as high as 8 GHz and above bandwidth, and high quantum efficiency over 90% over the entire wavelength region.

It is also our objective to develop a monolithic photodiode array (or single detector) for broad spectral ranges covering from <300 nm to 2500 nm with having the frequency response as high as 8 GHz and above bandwidth and high quantum efficiency over >90% over entire wavelength region.

Our innovative approach utilizes surface incident type (either top- or bottom-illuminated type) photodiode structure having single absorption layer which can provide broad spectral response. The absorption layers will be designed to achieve the required quantum efficiency and also required speed. The photodiode can be used as the single element and also as the array form.

In array form, for example top-illuminated type photodetector array, metal line to connect each pixel separately to the outside contact pads is utilized for making possible to rapidly and randomly address any pixel independently. As each metal line usually needs to connect outside pads to inside photodiode pixel (also mentioned as element), the pitch and element size is limited by the width of the metal line and array number. For example, the element size (i.e. photodiode pixel size) and pitch can be made to 5 μm and 10 μm, respectively, for the array size of 25×25 and metal line of 1 μm. For the bottom incident type of structure, the large number of pixels, even over 1000×1000 array of photodiode elements can also be possible.

According to the current invention, photodiodes having broad spectral ranges (<300 to 1700 nm and also <300 nm to 2500 nm), high quantum efficiency (>90%), and high frequency response, can be fabricated using the single wafer. According to this invention, in the case of photodiode array, each array can also be operated independently. The manufacturing thereof is also simpler as compared with the prior art. Some applications include multicolor imaging applications such as for astronomical observation, communication etc.

SUMMARY OF THE INVENTION

Accordingly, it is an object of the invention to provide the structures of single photodiode element, which could have the broad spectral detections, ranging from UV to near infrared. Two types of photodiodes structures are proposed; (a) one could cover from UV to 1700 nm and (b) other structure could cover UV to 2500 nm.

It is also an object that the structure of each element photodiode could provide high quantum efficiency over 90% and beyond over broad spectral detection ranges, and also the high frequency response, as high as 8 GHz and more (@ 3 dB bandwidth). The structure is easily to fabricate using the standard photodiode fabrication process.

Another object of this invention is to provide the photodiode array structure, which would have the broad spectral detection ranges, and each of its photodiode element (hereafter mentioned also as the pixel) could be operated independently. This photodiode array has the CCD like feature in addition to the broad spectral detection capabilities. This array of high counts can be used for multicolor imaging purpose.

It is also an object of the invention to provide the top (also mentioned as the 'front')-illuminated type and bottom (also mentioned as the 'back')-type photodiode, which uses the structures having broad spectral detection capability as, mentioned previously.

Another object of the present invention is to provide the material types to be used for achieving broader spectral detection ranges for photodiode. These materials are easy to deposit/growth using the standard IC technology.

Another object of the invention is to use the InGaAs as the absorption layer for the photodiode having broad spectral detection ranges, covering from <300 nm to 1700 nm.

It is also an object of the invention is to use the InGaAs as the absorption layer for the photodiode having broad spectral detection ranges, covering from <300 nm to 2500 nm.

It is also an object of the invention to use the InP wafer for fabricating the photodiode having broad spectral ranges.

Another object of the present invention is to provide the fabrication process to fabricate the single photodiode and its array using the standard IC fabrication process.

According to the invention, the single photodiode covering <300 nm to 1700 nm, comprises, (i) an ohmic contact layer; (ii) a substrate; (iii) a first highly doped buffer layer, material-type same as the substrate; (iv) intrinsic layer of InGaAs for absorption layer, fabricated on the top of the first doped layer; (v) a thin layer of second doped or lightly doped layer of InGaAs type or etch stopper layer on the top of absorption layer; (vi) a incident surface area opened on the thin recessed layer; (vii) a thick layer of doped second layer surrounding incident surface for the contact layer, and; (viii) second ohmic metal contact layer on the top of the thick-doped layer, wherein the light incident surface (opening area) could be the circular, rectangular or square shaped, and they are designed able to have the field distribution enough avoiding the diffusion related current.

To avoid large resistance due to the abrupt junction formation, the gradual doping can be used in between intrinsic absorption layer and the second highly doped layer. A thin layer of spacer layer of type second layer can be used in between the second highly doped layer and intrinsic layer.

According to the invention, the single photodiode covering <300 nm to 2500 nm, comprises, (i) an ohmic contact layer; (ii) a substrate; (iii) a first highly doped buffer layer, material-type same as the substrate; (iv) single or plurality layers of $InAs_yP_{1-y}$ type material of different y, where y is <1 but >0; (v) a intrinsic or lightly doped layer of InGaAs for absorption layer, fabricated on the top of the singular or plurality layers of $InAs_yP_{1-y}$ type material; (vi) a thin layer of second highly doped and/or lightly doped layer of InGaAs type as recessed layer or a thin layer of the etch stopper layer on the top of absorption layer; (vii) a incident surface area of the opened on the thin recessed layer; (viii) a thick layer of highly doped second layer of InGaAs type, surrounding the incident surface for the contact layer, and; (ix) second ohmic metal contact layer on the top of the thick doped layer; wherein the light incident surface (opening area) could be the circular, rectangular or square shaped, and they are designed able to have the field distribution enough avoiding the diffusion related current.

To avoid large resistance due to the abrupt junction formation, the gradual doping can be used in between intrinsic absorption layer and the second highly doped layer. A thin spacer-layer of type second layer can be used in between the second highly doped layer and intrinsic layer.

Alternately, a graded layer can be incorporated in the structure to reduce the minority carrier trapping at the InAsP/InGaAs band edge discontinuity.

According to the invention, the photodiode array comprises: N×N array of photodiode elements, wherein each photodiode element (having broad spectral ranges of <300 nm to 1700 nm), comprises, (a) an ohmic contact layer; (b) a substrate; (c) a first highly doped buffer layer, material-type same as the substrate; (d) intrinsic layer of InGaAs for absorption layer, fabricated on the top of the first doped layer; (e) a thin layer of second doped or lightly doped layer of InGaAs type or etch stopper layer on the top of absorption layer; (f) a incident surface area opened on the thin recessed layer; (g) a thick layer of doped second layer surrounding incident surface for the contact layer, and; (h) second ohmic metal contact layer on the top of the thick doped layer; wherein the light incident surface (opening area) of each photodiode element could be the circular, could be the circular, rectangular or square shaped, and they are designed able to have the field distribution enough avoiding the diffusion related current; interconnection metal line connecting each photodiode to the outside pad, wherein each photodiode is independently addressable, and; common ohmic metal contact layer on the backside of the substrate for all photodiodes in the array.

According to the invention, the photodiode array comprises:

(i) N×N photodiodes, wherein each photodiode (having broad spectral ranges of <300 nm to 1700 nm), comprises
 (a) an ohmic contact layer;
 (b) a substrate;
 (c) a first highly doped buffer layer, material-type same as the substrate;
 (d) intrinsic layer of InGaAs for absorption layer, fabricated on the top of the first doped layer;
 (e) a thin layer of second doped or lightly doped layer of InGaAs type or etch stopper layer on the top of absorption layer;
 (f) a incident surface area opened on the thin recessed layer;
 (g) a thick layer of doped second layer surrounding incident surface for the contact layer, and;
 (h) second ohmic metal contact layer on the top of the thick doped layer;
 wherein the light illuminating surface (opening area) of each photodiode element could be the circular, could be the circular, rectangular or square shaped, and they are designed able to have the field distribution enough avoiding the diffusion related current;
(ii) interconnection metal line connecting the photodiodes in a way that at a time only one photodiode signal can be taken out located in the same row and column, and;
(iii) common ohmic metal contact layer on the backside of the substrate for all photodiodes in the array.

According to the invention, the photodiode array comprises:
(i) N×N array of photodiode elements, wherein each photodiode element (having broad spectral ranges of <300 nm to 2500 nm), comprises,
 (a) an ohmic contact layer;

(b) a substrate;

(c) a first highly doped buffer layer, material-type same as the substrate;

(d) single or plurality layers of $InAs_yP_{1-y}$ type material of different y, where y is <1 but >0;

(e) a intrinsic or lightly doped layer of InGaAs for absorption layer fabricated on the top of the singular or plurality layers of $InAs_yP_{1-y}$ type material;

(f) a thin layer of second highly doped and/or lightly doped layer of InGaAs type as recessed layer or a thin layer of the etch stopper layer on the top of absorption layer;

(g) a incident surface area of the opened on the thin recessed layer;

(h) a thick layer of highly doped second layer of InGaAs type, surrounding the incident surface for the contact layer, and;

(i) second ohmic metal contact layer on the top of the thick-doped layer;

wherein the light incident surface (opening area) of each photodiode element could be the circular, rectangular or square shaped, and they are designed able to have the field distribution enough avoiding the diffusion related current;

(ii) interconnection metal line connecting each photodiode to the outside pad, wherein each photodiode is independently addressable, and;

(iii) common ohmic metal contact layer on the backside of the substrate for all photodiodes in the array.

According to the invention, the photodiode array comprises:

(i) N×N photodiodes, wherein each photodiode (having broad spectral ranges of <300 nm to 2500 nm), comprises, (a) an ohmic contact layer;

(b) a substrate;

(c) a first highly doped buffer layer, material-type same as the substrate;

(d) single or plurality layers of $InAs_yP_{1-y}$ type material of different y, where y is <1 but >0;

(e) a intrinsic or lightly doped layer of InGaAs for absorption layer fabricated on the top of the singular or plurality layers of $InAs_yP_{1-y}$ type material;

(f) a thin layer of second highly doped and/or lightly doped layer of InGaAs type as recessed layer or a thin layer of the etch stopper layer on the top of absorption layer;

(g) a incident surface area of the opened on the thin recessed layer;

(h) a thick layer of highly doped second layer of InGaAs type, surrounding the incident surface for the contact layer, and;

(i) second ohmic metal contact layer on the top of the thick doped layer;

wherein the light incident surface (opening area) of each photodiode element could be the circular, rectangular or square shaped, and they are designed able to have the field distribution enough avoiding the diffusion related current;

(ii) interconnection metal line connecting the photodiodes in a way that at a time only one photodiode signal can be taken out located in the same row and column, and;

(iii) common ohmic metal contact layer on the backside of the substrate for all photodiodes in the array.

It is also an object of this invention to provide the interconnection scheme where metal connection connecting each photodiode element to the outside pad and this can be designed in a way that metal contacts of the photodiodes located one-fourth of the array are designed to align in two sides. Replica of this metal layout can be copied for metal contacts alignment for other photodiodes located in the three-fourth of the array.

According to the invention, the fabrication process of the photodiode comprises, (i) growing the layers forming the photodiode structure on the substrate;

(ii) patterning and dry etching the second high doped layer to open the incident surface and keep the thin recessed layer of the second highly doped layer;

(iii) formation of the top ohmic contact;

(iv) formation of the AR coating on the opening surface, and;

(v) polishing the substrate and formation of the bottom ohmic contact, wherein thin recessed layer of the second highly doped layer is left on the top of the incident layer to distribute the electrical filed on the incident surface.

According to the invention, the fabrication process of the photodiode comprises, growing the layers forming the photodiode structure on the substrate;

patterning and formation of the top ohmic contact;

etching the portion of the second highly doped layer to open the incident surface and keep the thin recessed layer of the second highly doped layer;

formation of the AR coating on the opening surface, and;

polishing the substrate and formation of the bottom ohmic contact, wherein the thin recessed layer of the second highly doped layer on the top of the incident layer to distribute the electrical filed on the incident surface.

According to the invention, the fabrication process of the photodiode array comprises:

growing the layers forming the photodiode structure on the substrate;

patterning and dry etching the portion of the second highly doped layer to open the incident surface, and keep the thin recessed layer of second highly doped layer on the incident surface;

patterning and formation of the top ohmic contact;

depositing the step coverage layer and planarization;

patterning and formation of metal contact connecting photodiode's top contact to the outside pad;

patterning and etch out the dielectric portion from the incident surface, deposition of the passivation layer as the AR coat on the incident surface, and;

formation of the common ohmic contact at the backside of the substrate.

According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array comprises:

growing the layers forming the photodiode structure on the substrate;

patterning and deposition of top metal and formation of the ohmic contact;

etching (dry or wet) the portion of the second highly doped layer to open the incident surface, and keep the thin recessed layer of second highly doped layer on the incident surface;

depositing the step coverage layer and planarization;

patterning and formation of metal contact connecting photodiode's top contact to the outside pad;

patterning and etch out the dielectric portion from the incident surface, deposition of the passivation layer as the AR coat on the incident surface, and;

formation of the common ohmic contact at the backside of the substrate.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array comprises:

growing the layers forming the photodiode structure on the substrate;

patterning and dry etching the portion of the second highly doped layer to open the incident surface, and keep the thin recessed layer of second highly doped layer on the incident surface;

patterning and formation of the top ohmic contact;

patterning and dry etching up to the substrate surface outside of each photodiode to isolate each photodiode;

depositing the step coverage layer and planarization;

patterning and formation of metal contact connecting photodiode's top contact to the outside pad;

patterning and etch out the dielectric portion from the incident surface, deposition of the passivation layer as the AR coat on the incident surface, and;

formation of the common ohmic contact at the backside of the substrate.

According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array comprises:

growing the layers forming the photodiode structure on the substrate;

patterning and deposition of top metal and formation of the ohmic contact;

etching (dry or wet) the portion of the second highly doped layer to open the incident surface, and keep the thin recessed layer of second highly doped layer on the incident surface;

patterning and dry etching up to the substrate surface outside of each photodiode to isolate each photodiode;

depositing the step coverage layer and planarization;

patterning and formation of metal contact connecting photodiode's top contact to the outside pad;

patterning and etch out the dielectric portion from the incident surface, deposition of the passivation layer as the AR coat on the incident surface, and;

formation of the common ohmic contact at the backside of the substrate.

According to this invention, the antireflection (AR) coating layer is to be compatible for the wavelength ranges to be detected to reduce the reflection loss. This AR coating could be the single layer or multiplayer combinations.

According to the invention, the single photodiode covering <300 nm to 1700 nm, comprises, an ohmic contact layer on the substrate;

a back side etching of the substrate to open the incident;

a AR coating;

a single or plurality of highly doped thin layers of InP or InGaAs;

intrinsic layer of InGaAs for absorption layer, fabricated on the top of the first doped layer;

a thin layer of second doped or lightly doped layer of InGaAs type on the top of absorption layer;

a thick layer of highly doped InP or InGaAs layer on the top of the lightly doped layer, and;

an top ohmic contact wherein the light incident surface (opening area at the back side of the substrate) could be the circular, rectangular or square shaped. The opening area along with the thickness of thin layer of highly doped InP or InGaAs are designed to have the field distribution enough avoiding the diffusion related current.

According to this invention, in order to avoid large resistance due to the abrupt junction formation, the gradual doping can be used in between intrinsic absorption layer and the second highly doped InP or InGaAs layer. A thin layer of spacer layer of InP or InGaAs type can be used in between the second highly doped InP or InGaAs layer and InGaAs absorption layer.

Alternatively, according to the invention, the single photodiode covering <300 nm to 1700 nm, comprises, a back side etching of the substrate to open the incident area;

an AR coating;

a single or plurality of highly doped thin layers of InP or InGaAs;

intrinsic layer of InGaAs for absorption layer, fabricated on the top of the first doped layer;

a thin layer of second doped or lightly doped layer of InGaAs type on the top of absorption layer;

a thick layer of highly doped InP or InGaAs layer on the top of the lightly doped layer;

an ohmic contact on the top, and;

an ohmic contact made with highly doped layer or substrate after etching out the layers;

wherein the light incident surface (opening area at the back side of the substrate) could be the circular, rectangular or square shaped. The opening area along with the thickness of thin layer of highly doped InP or InGaAs are designed to have the field distribution enough avoiding the diffusion related current.

According to this invention, in order to avoid large resistance due to the abrupt junction formation, the gradual doping can be used in between intrinsic absorption layer and the second highly doped InP or InGaAs layer. A thin layer of spacer layer of InP or InGaAs type can be used in between the second highly doped InP or InGaAs layer and InGaAs absorption layer.

According to the invention, the photodiode array comprises:

(i) N×N array of photodiode elements, wherein each photodiode element (having broad spectral ranges of <300 nm to 1700 nm), comprises, (a) a common ohmic contact layer;

(b) a backside etched InP substrate;

(c) a single or plurality layers of highly doped buffer layers;

intrinsic layer of InGaAs for absorption layer, fabricated on the top of the first doped layer;

a thin layer of lightly doped InGaAs or InP type on the top of absorption layer;

a thick layer of doped InGaAs or InP layer, and;

second ohmic metal contact layer on the top of the thick doped layer;

(ii) a dielectric layer isolating the each photodiode element;

(iii) interconnection metal line connecting each photodiode to the outside pad, wherein each photodiode is independently addressable;

(iv) a planaraized dielectric or epoxy layer, and;

(v) a substrate of dielectric or semiconductor.

According to the invention, the photodiode array comprises:

(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   intrinsic layer of InGaAs for absorption layer, fabricated on the top of the first doped layer;
   (d) a thin layer of lightly doped InGaAs or InP type on the top of absorption layer;
   (e) a thick layer of doped InGaAs or InP layer, and;
   (f) second ohmic metal contact layer on the top of the thick doped layer;
   (ii) a dielectric layer isolating the each photodiode element;
   (iii) interconnection metal line connecting the photodiodes in a way that at a time only one photodiode signal can be taken out located in the same row and column;
   (iv) a planaraized dielectric or epoxy layer, and;
   (v) a substrate of dielectric or semiconductor.

According to the invention, the photodiode array comprises:
(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   (d) intrinsic layer of InGaAs for absorption layer, fabricated on the top of the first doped layer;
   (e) a thin layer of lightly doped InGaAs or InP type on the top of absorption layer;
   (f) a thick layer of doped InGaAs or InP layer, and;
   (g) second ohmic metal contact layer on the top of the thick doped layer;
   (ii) a dielectric layer isolating the each photodiode element, and;
   (iii) interconnection metal line connecting each photodiode to the outside pad, wherein each photodiode is independently addressable.

Alternatively, according to the invention, the photodiode array comprises:
(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   (d) intrinsic layer of InGaAs for absorption layer, fabricated on the top of the first doped layer;
   (e) a thin layer of lightly doped InGaAs or InP type on the top of absorption layer;
   (f) a thick layer of doped InGaAs or InP layer, and;
   (g) second ohmic metal contact layer on the top of the thick doped layer;
   (ii) a dielectric layer isolating the each photodiode element, and;
   (iii) interconnection metal line connecting the photodiodes in a way that at a time only one photodiode signal can be taken out located in the same row and column.

Alternatively, according to the invention, the photodiode array comprises:
(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   (d) intrinsic layer of InGaAs for absorption layer, fabricated on the top of the first doped layer;
   (f) a thin layer of lightly doped InGaAs or InP type on the top of absorption layer;
   (g) a thick layer of doped InGaAs or InP layer, and;
   (h) second ohmic metal contact layer on the top of the thick doped layer, and;
   (ii) a dielectric layer isolating the each photodiode element.
wherein the interconnection of each photodiode element to the outside can be done by upside down the whole array structure and bonded to each photodiode element to the metal pads located on the different substrate. The light is incident from the backside of the etched substrate.

According to the invention, the photodiode array comprises:
(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   (d) intrinsic layer of InGaAs for absorption layer, fabricated on the top of the first doped layer;
   (e) a thin layer of lightly doped InGaAs or InP type on the top of absorption layer;
   (f) a thick layer of doped InGaAs or InP layer which is etched up to the top of the lightly dopded or non-doped InP or InGaAs layer to isolate each photodiode element, and;
   (g) second ohmic metal contact layer on the top of doped layer;
   (ii) a dielectric layer isolating the each photodiode element;
   interconnection metal line connecting each photodiode to the outside pad, wherein each photodiode is independently addressable;
   (iii) a planaraized dielectric or epoxy layer, and;
   (iv) a substrate of dielectric or semiconductor bonded on the top of the planarized dielectric or epoxy layer.

According to the invention, the photodiode array comprises:
(i) N×N array of photodiode elements, wherein each photodiode element (having broad spectral ranges of <300 nm to 1700 nm), comprises,
   (a) a common ohmic contact layer;
   (b) a backside etched InP substrate;
   (c) a single or plurality layers of highly doped buffer layers;
   (d) intrinsic layer of InGaAs for absorption layer, fabricated on the top of the first doped layer;
   (e) a thin layer of lightly doped InGaAs or InP type on the top of absorption layer;
   (f) a thick layer of doped InGaAs or InP layer which is etched up to the top of the lightly dopded or non-doped InP or InGaAs layer to isolate each photodiode element, and;
   (g) second ohmic metal contact layer on the top of doped layer;
   (ii) a dielectric layer isolating the each photodiode element;
   interconnection metal line connecting the photodiodes in a way that at a time only one photodiode signal can be taken out located in the same row and column;
   (iii) a planaraized dielectric or epoxy layer, and;
   (iv) a substrate of dielectric or semiconductor.

According to the invention, the photodiode array comprises:

(i) N×N array of photodiode elements, wherein each photodiode element (having broad spectral ranges of <300 nm to 1700 nm), comprises,
    (a) a common ohmic contact layer;
    (b) a backside etched InP substrate;
    (c) a single or plurality layers of highly doped buffer layers;
    (d) intrinsic layer of InGaAs for absorption layer, fabricated on the top of the first doped layer;
    (e) a thin layer of lightly doped InGaAs or InP type on the top of absorption layer;
    (f) a thick layer of doped InGaAs or InP layer which is etched up to the top of the lightly dopded or non-doped InP or InGaAs layer to isolate each photodiode element, and;
    (g) second ohmic metal contact layer on the top of doped layer;
    (ii) a dielectric layer isolating the each photodiode element, and;
    (iii) interconnection metal line connecting each photodiode to the outside pad, wherein each photodiode is independently addressable.

Alternatively, according to the invention, the photodiode array comprises:
    (i) N×N array of photodiode elements, wherein each photodiode element (having broad spectral ranges of <300 nm to 1700 nm), comprises,
    (a) a common ohmic contact layer;
    (b) a backside etched InP substrate;
    (c) a single or plurality layers of highly doped buffer layers;
    (d) intrinsic layer of InGaAs for absorption layer, fabricated on the top of the first doped layer;
    (g) a thin layer of lightly doped InGaAs or InP type on the top of absorption layer;
    (h) a thick layer of doped InGaAs or InP layer which is etched up to the top of the lightly dopded or non-doped InP or InGaAs layer to isolate each photodiode element, and;
    (i) second ohmic metal contact layer on the top of doped layer;
    (ii) a dielectric layer isolating the each photodiode element, and;
    (iii) interconnection metal line connecting the photodiodes in a way that at a time only one photodiode signal can be taken out located in the same row and column.

Alternatively, according to the invention, the photodiode array comprises:
    (i) N×N array of photodiode elements, wherein each photodiode element (having broad spectral ranges of <300 nm to 1700 nm), comprises,
    (a) a common ohmic contact layer;
    (b) a backside etched InP substrate;
    (c) a single or plurality layers of highly doped buffer layers;
    (d) intrinsic layer of InGaAs for absorption layer, fabricated on the top of the first doped layer;
    (e) a thin layer of lightly doped InGaAs or InP type on the top of absorption layer;
    (f) a thick layer of doped InGaAs or InP layer which is etched up to the top of the lightly dopded or non-doped InP or InGaAs layer to isolate each photodiode element, and;
    (g) second ohmic metal contact layer on the top of doped layer;
    (ii) a dielectric layer isolating the each photodiode element.
    wherein the interconnection of each photodiode element to the outside can be done by upside down the whole array structure and bonded each photodiode element to the metal pads located on the independent substrate. The light is incident from the backside of the etched substrate.

According to the invention, AR coating is also used on the top of the thin high doped InP or InGaAs after the etching the bottom side of the InP substrate.

According to the invention, the photodiode array comprises:
    (i) N×N array of photodiode elements, wherein each photodiode element (having broad spectral ranges of <300 nm to 1700 nm), comprises,
    (a) a backside etched InP substrate;
    (b) a single or plurality layers of highly doped layers of InP or InGaAs;
    (c) intrinsic layer of InGaAs for absorption layer, fabricated on the top of the first doped layer;
    (d) a thin layer of lightly doped InGaAs or InP type on the top of absorption layer;
    (e) a thick layer of doped InGaAs or InP layer,
    (f) a first ohmic contact on the top of the highly doped thick layer,
    (g) a dielectric to isolate the second, and;
    (h) a common second ohmic contact made with the highly doped InP (or InGaAs) layer or InP substrate after etching out the layers;
    a dielectric layer isolating the each photodiode element;
    (ii) interconnection metal line connecting each photodiode to the outside pad, wherein each photodiode is independently addressable;
    (iii) a planaraized dielectric or epoxy layer, and;
    (iv) a substrate of dielectric or semiconductor.

Alternatively, according to the invention, the photodiode array comprises:
    (i) N×N array of photodiode elements, wherein each photodiode element (having broad spectral ranges of <300 nm to 1700 nm), comprises,
    a backside etched InP substrate;
    a single or plurality layers of highly doped layers of InP or InGaAs;
    intrinsic layer of InGaAs for absorption layer, fabricated on the top of the first doped layer;
    a thin layer of lightly doped InGaAs or InP type on the top of absorption layer;
    a thick layer of doped InGaAs or InP layer,
    a first ohmic contact on the top of the highly doped thick layer,
    a dielectric to isolate the second, and;
    a common second ohmic contact made with the highly doped InP (or InGaAs) layer or InP substrate after etching out the layers, and;
    (ii) a planarized dielectric layer isolating the each photodiode element;
    wherein the interconnection of each photodiode element to the outside can be done by upside down the whole array structure and bonded each photodiode element to the metal pads located on the independent substrate. The light is incident from the backside of the etched substrate.

According to the invention, AR coating is also used on the top of the thin high doped InP or InGaAs after the etching the bottom side of the InP substrate.

According to the invention, the fabrication process of the photodiode comprises,
    (i) growing the layers forming the photodiode structure on the substrate;
    (ii) patterning and formation of the top ohmic contact;
    (iii) patterning and formation of the bottom electrode outside the incident area;
    (iv) etching the bottom of the substrate to create the incident area, and;
    (v) deposition of the AR coating on the incident surface.

According to the invention, the fabrication process of the photodiode comprises, (i) growing the layers forming the photodiode structure on the substrate;

(ii) deposition of the dielectric layer on the bottom side of the substrate;

(iii) patterning and etching out the dielectric portion from the bottom side for incident area;

(iv) patterning and formation of the top ohmic contact;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;

(ix) etching the bottom of the substrate to create the incident area, and;

(x) deposition of the AR coating on the incident surface.

According to the invention, the fabrication process of the photodiode array of N×N photodiode elements, comprises, (i) growing the layers forming the photodiode structure on the substrate;

(ii) patterning and formation of the top ohmic contacts of N×N;

(iii) deposition of the dielectric layer and planarization;

(iv) metallization at the backside of the substrate;

(v) patterning and etch out the metal portion from the incident surface;

(vi) formation of bottom common ohmic contacts at the backside of the substrate;

(vii) patterning and formation of metal lines connecting photodiode's top contact to the outside pad;

(viii) formation of dielectric or epoxy layer;

(ix) attachment of the quartz or semiconductor on the dielectric or epoxy layer;

(x) etching out the backside of the substrate to open the incident area, and;

(xi) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array of N×N photodiode elements, comprises, (i) growing the layers forming the photodiode structure on the substrate;

(ii) patterning and formation of the top ohmic contacts of N×N;

deposition of the dielectric layer and planarization;

(iii) metallization at the backside of the substrate;

patterning and etch out the metal portion from the incident surface;

(iv) formation of bottom common ohmic contacts at the backside of the substrate;

(v) patterning and formation of metal lines connecting photodiode's top contact to the outside pad;

(vi) etching out the backside of the substrate to open the incident area, and;

(vii) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

Alternatively, according to the invention, the fabrication process of the photodiode array of N×N photodiode elements, comprises, (i) growing the layers forming the photodiode structure on the substrate;

(ii) patterning and formation of the top ohmic contacts of N×N;

(iii) deposition of the dielectric layer and planarization;

(iv) metallization at the backside of the substrate;

(v) patterning and etch out the metal portion from the incident surface;

(vi) formation of bottom common ohmic contacts at the backside of the substrate;

(vii) etching out the backside of the substrate to open the incident area, and;

(viii) deposition of the passivation layer as the AR coat on the incident surface, According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure on the substrate;

(ii) deposition of the dielectric layer on the bottom side of the substrate;

(iii) patterning and etching out the dielectric portion from the bottom side to open the incident area;

(iv) patterning and formation of the top ohmic contacts of N×N;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;

(ix) patterning and formation of metal lines connecting photodiode's top contact to the outside pad;

(x) formation of dielectric or epoxy layer;

(xi) attachment of the quartz or semiconductor on the dielectric or epoxy layer;

(xii) etching out the backside of the substrate to open the incident area, and;

(xiii) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises, (i) growing the layers forming the photodiode structure on the substrate;

(ii) deposition of the dielectric layer on the bottom side of the substrate;

(iii) patterning and etching out the dielectric portion from the bottom side to open the incident area;

(iv) patterning and formation of the top ohmic contacts of N×N;

(v) patterning and etching to make the hole from top to first highly doped layer or up to the substrate;

(vi) formation of the dielectric layer;

(vii) patterning and etching the dielectric layer outside the etched hole;

(viii) metallization and formation of the bottom electrode which is connected from the top;
(ix) patterning and formation of metal lines connecting photodiode's top contact to the outside pad;
(x) etching out the backside of the substrate to open the incident area, and;
(xi) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises,
(i) growing the layers forming the photodiode structure on the substrate;
(ii) deposition of the dielectric layer on the bottom side of the substrate;
(iii) patterning and etching out the dielectric portion from the bottom side to open the incident area;
(iv) patterning and formation of the top ohmic contacts of N×N;
(v) patterning and etching to make the hole from top to first highly doped layer or up to the substrate;
(vi) formation of the dielectric layer;
(vii) patterning and etching the dielectric layer outside the etched hole;
(viii) metallization and formation of the bottom electrode which is connected from the top;
(ix) etching out the backside of the substrate to open the incident area, and;
(x) etching out the dielectric layer and deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises,
(i) growing the layers forming the photodiode structure as mentioned previously;
(ii) patterning and formation of the top ohmic contacts of N×N;
(iii) formation of the top-ohmic contacts for N×N elements;
(iv) etching of the top highly doped layer outside from the top contacts;
(v) deposition of the dielectric layer and planarization;
(vi) metallization at the backside of the substrate;
(vii) patterning and etch out the metal portion from the incident surface;
(viii) formation of bottom common ohmic contacts at the backside of the substrate;
(ix) patterning and formation of metal lines connecting photodiode's top contact to the outside pad;
(x) formation of dielectric or epoxy layer;
(xi) attachment of the quartz or semiconductor on the dielectric or epoxy layer;
(xii) etching out the backside of the substrate to open the incident area, and;
(xiii) deposition of the passivation layer as the AR coat on the incident surface.

According to the invention, the fabrication process of the photodiode array of N×N elements, comprises,
(i) growing the layers forming the photodiode structure as mentioned previously;
(ii) patterning and formation of the top ohmic contacts of N×N;
(iii) formation of the top-ohmic contacts for N×N elements;
(iv) etching of the top highly doped layer outside from the top contacts;
(v) deposition of the dielectric layer and planarization;
(vi) metallization at the backside of the substrate;
(vii) patterning and etch out the metal portion from the incident surface;
(viii) formation of bottom common ohmic contacts at the backside of the substrate;
(ix) patterning and formation of metal lines connecting photodiode's top contact to the outside pad;
(x) etching out the backside of the substrate to open the incident area, and;
(xi) deposition of the passivation layer as the AR coat on the incident surface.

According to the invention, the fabrication process of the photodiode array of N×N elements, comprises,
(i) growing the layers forming the photodiode structure as mentioned previously;
(ii) patterning and formation of the top ohmic contacts of N×N;
(iii) formation of the top-ohmic contacts for N×N elements;
(iv) etching of the top highly doped layer outside from the top contacts;
(v) deposition of the dielectric layer and planarization;
(vi) metallization at the backside of the substrate;
(viii) patterning and etch out the metal portion from the incident surface;
(ix) formation of bottom common ohmic contacts at the backside of the substrate;
(x) etching out the backside of the substrate to open the incident area, and;
(xi) deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

According to the invention, the fabrication process of the photodiode array of N×N elements, comprises,
(i) growing the layers forming the photodiode structure as mentioned previously;
(ii) deposition of the dielectric layer on the bottom side of the substrate;
(iii) patterning and etching out the dielectric portion from the bottom side to open the incident area;
(iv) formation of the top-ohmic contacts for N×N elements;
(v) etching of the top highly doped layer outside from the top contacts;
(vi) deposition of the dielectric layer and planarization;
(vii) patterning and etching to make the hole from top to first highly doped layer or up to the substrate;
(viii) formation of the dielectric layer;
(ix) patterning and etching the dielectric layer outside the etched hole;
(x) metallization and formation of the bottom common ohmic contact which is connected from the top;
(xi) patterning and formation of metal lines connecting photodiode's top contact to the outside pad;
(xii) formation of dielectric or epoxy layer;
(xiii) attachment of the quartz or semiconductor on the dielectric or epoxy layer;

(xiv) etching out the backside of the substrate to open the incident area, and;

(xv) deposition of the passivation layer as the AR coat on the incident surface.

According to the invention, the fabrication process of the photodiode array of N×N elements, comprises, (i) growing the layers forming the photodiode structure as mentioned previously;

(ii) deposition of the dielectric layer on the bottom side of the substrate;

(iii) patterning and etching out the dielectric portion from the bottom side to open the incident area;

(iv) formation of the top-ohmic contacts for N×N elements;

(v) etching of the top highly doped layer outside from the top contacts;

(vi) deposition of the dielectric layer and planarization;

(vii) patterning and etching to make the hole from top to first highly doped layer or up to the substrate;

(ix) formation of the dielectric layer;

(x) patterning and etching the dielectric layer outside the etched hole;

(xi) metallization and formation of the bottom common ohmic contact which is connected from the top;

(xii) patterning and formation of metal lines connecting photodiode's top contact to the outside pad;

(xiii) etching out the backside of the substrate to open the incident area, and;

(xiv) deposition of the passivation layer as the AR coat on the incident surface.

According to the invention, the fabrication process of the photodiode array of N×N elements, comprises, (i) growing the layers forming the photodiode structure as mentioned previously;

(ii) deposition of the dielectric layer on the bottom side of the substrate;

(iii) patterning and etching out the dielectric portion from the bottom side to open the incident area;

(iv) formation of the top-ohmic contacts for N×N elements;

(v) etching of the top highly doped layer outside from the top contacts;

(vi) deposition of the dielectric layer and planarization;

(vii) patterning and etching to make the hole from top to first highly doped layer or up to the substrate;

(viii) formation of the dielectric layer;

(ix) patterning and etching the dielectric layer outside the etched hole;

(x) metallization and formation of the bottom common ohmic contact which is connected from the top;

(xi) etching out the backside of the substrate to open the incident area, and;

(xiii) deposition of the passivation layer as the AR coat on the incident surface.

According to this invention, the antireflection (AR) coating layer is to be compatible for the wavelength ranges to be detected to reduce the reflection loss. This AR coating could be the single layer or multiplayer combinations.

It is an object of this invention to provide the bonding technique of the single photodiode and photodiode array on the carrier on which the logic circuit is bonded or monolithically fabricated.

According to this invention the bonding process of the bottom incident photodiode having broad spectral detection ranges (covering from <300 nm to 1700 nm and also <300 nm to 2500 nm) comprises the bonding of the upside down photodiode (and array) to the carrier wherein the same number pads as that of the photodiode array are present for electrical connections. The detector array is bonded by the flip-chip bonding technique using the solder bumps in between the contacts.

According to these inventions, the detector array having the metal line connecting each contact to the outside pads can be connected with the pads to carrier pads by flip-chip bonding.

According to this invention, the detector having the contacts itself as the pads can be directly bonded with the pads on the carrier, layout designed compatible for the detector array.

According to this invention, the detector array previously described having the quartz or semiconductor for making easiness of etching of substrate, can also be bonded on the carrier having the logic circuit using the flip-chip bonding. The difference here is that the carrier is designed with groove to fit the quartz or semiconductor attached on the photodiode array. The high thermal conductive epoxy can be used in the space between the groove and quartz or semiconductor.

According to this invention, the substrate could be InP or GaAs, and absorption layer is InGaAs or InGaP with thickness appropriate to get broad ranges of the spectral responses (from <300 nm to 1700 nm and also possible to get from <300 nm to 2500 nm), high quantum efficiency and high frequency response.

According to this invention, the interface between the InP and InGaAs can be made smooth junction using the grading layer in between.

The invention offers to detect broad detection ranges varying from UV to near infrared as high as 2500 nm with high quantum efficiency and high frequency response. With proper design and fabrication process, N×N photodiodes array can be fabricated with capability of independently addressable each photodiode. The photodiode array will have the CCD like feature with broad spectral detection capability. The signal processing circuit can also be integrated monolithically or hybrid. These inventions could be easily implementable as today's manufacturing technology can be used. The detector mentioned in this invention will be used for multiple purpose optical detection for many applications.

Another advantage of this invention is that conventional material and IC fabrication technology can be usable to fabricate this photodiode and its array.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIGS. 7A and 7B are the schematics showing the cross-sectional view of back-illuminated photodiode structures having the spectral responses from <<300 nm to 1700 nm in the eleventh embodiment in accordance to the present invention;

FIGS. 9A, 9B, and 9C are the schematics showing the cross-sectional view of back-illuminated photodiode structures having broad spectral responses in the thirteenth embodiment in accordance to the present invention;

FIGS. 10A, 10B, 10C are the schematics showing the cross-sectional view of back-illuminated photodiode structures having broad spectral responses in the fourteenth embodiment in accordance to the present invention;

FIGS. 11A, 11B, 11C are the schematics showing the cross-sectional view of back-illuminated photodiode structures having two contacts on the top in the fifteenth embodiment in accordance to the present invention;

FIG. 12A to FIG. 12D is the schematics showing the fabrication processes of the back-illuminated single photodiode in the sixteenth embodiment in accordance to the present invention;

FIG. 13A to FIG. 13D is the schematics showing alternative fabrication processes of the back-illuminated single photodiode in the seventeenth embodiment in accordance to the present invention;

FIGS. 14A to 14E are the schematics showing the cross-sectional views of the fabrication process for the back-illuminated photodiode array having interconnection metal lines in the eighteenth embodiment in accordance to the present invention.

FIGS. 15A to 15D are the schematics showing the cross-sectional views of the fabrication process for the back-illuminated photodiode array having interconnection metal lines in the nineteenth embodiment in accordance to the present invention.

FIGS. 16A to 16C are the schematics showing the cross-sectional views of the fabrication process for the back-illuminated photodiode array without having interconnect metal lines in the twentieth embodiment in accordance to the present invention.

FIGS. 17A to 17E are the schematics showing the cross-sectional views of the fabrication process for the back-illuminated photodiode array having both contacts on the top and also having interconnection metal lines in the twenty-first embodiment in accordance to the present invention.

FIGS. 18A to 18D are the schematics showing the cross-sectional views of the fabrication process for the back-illuminated photodiode array having both contacts on the top and also having interconnection metal lines in the twenty-second embodiment in accordance to the present invention.

FIGS. 19A to 19C are the schematics showing the cross-sectional views of the fabrication process for the back-illuminated photodiode array having both contacts on the top and without having interconnect metal lines in the twenty-third embodiment in accordance to the present invention.

FIGS. 20A to 20F are the schematics showing the cross-sectional views of the fabrication process for the back-illuminated photodiode array having interconnection metal lines in the twenty-fourth embodiment in accordance to the present invention. In this case, the top highly doped is etched away to isolate each pixel to reduce the noise.

FIGS. 21A to 21E are the schematics showing the cross-sectional views of the fabrication process for the back-illuminated photodiode array having interconnection metal lines in the twenty-fifth embodiment in accordance to the present invention. In this case, the top highly doped is etched away to isolate each pixel to reduce the noise.

FIGS. 22A to 22D are the schematics showing the cross-sectional views of the fabrication process for the back-illuminated photodiode array without having interconnect metal lines in the twenty-sixth embodiment in accordance to the present invention. In this case, the top highly doped is etched away to isolate each pixel to reduce the noise.

FIGS. 23A to 23F are the schematics showing the cross-sectional views of the fabrication process for the back-illuminated photodiode array having both contacts on the top and also having interconnection metal lines in the twenty-seventh embodiment in accordance to the present invention. In this case, the top highly doped is etched away to isolate each pixel to reduce the noise.

FIGS. 24A to 24D are the schematics showing the cross-sectional views of the fabrication process for the back-illuminated photodiode array having both contacts on the top and also having interconnection metal lines in the twenty-eighth embodiment in accordance to the present invention. In this case, the top highly doped is etched away to isolate each pixel to reduce the noise.

FIGS. 25A to 25E are the schematics showing the cross-sectional views of the fabrication process for the back-illuminated photodiode array having both contacts on the top and without having interconnect metal lines in the twenty-ninth embodiment in accordance to the present invention. In this case, the top highly doped is etched away to isolate each pixel to reduce the noise.

DESCRIPTION OF THE PREFERRED EMBODIMENTS

Figure 1A:
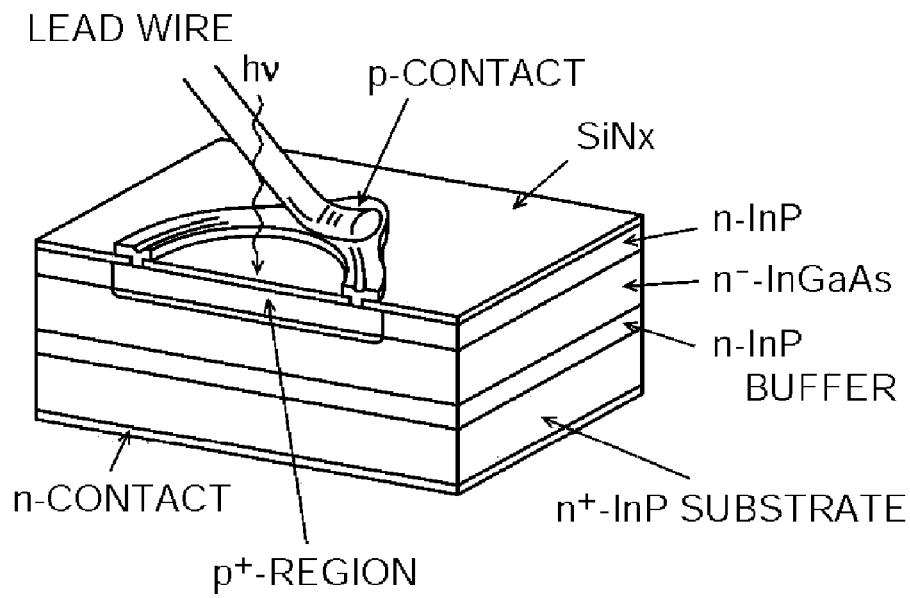
FIGS. 1A and 1B are the schematics showing the cross-sectional views of photodiode structures. These are the explanatory diagrams showing the prior-art of today's photodiodes.

The best modes for carrying out the present invention will be described in turn with reference to the accompanying drawings. In the following description, the same reference numerals denote components having substantially the same functions and arrangements, and duplicate explanation will be made only where necessary.

Here the structure and design we mention are for both top (also mentioned as 'front')-illuminated and bottom (also mentioned as 'back')-illuminated type photodetector and their array having broad spectral detection ranges. The main objective of this invention is to make the broad spectral detector and their array using the InGaAs using the InP substrate. This covers all photodiode and their array with broad spectral detection ranges from <300 nm to 1700 nm and also <300 nm to 2500 nm, which uses the InGaAs as the absorption layer. With changing the structures a little similar feature photodiode can also be made.

Figure 1B:
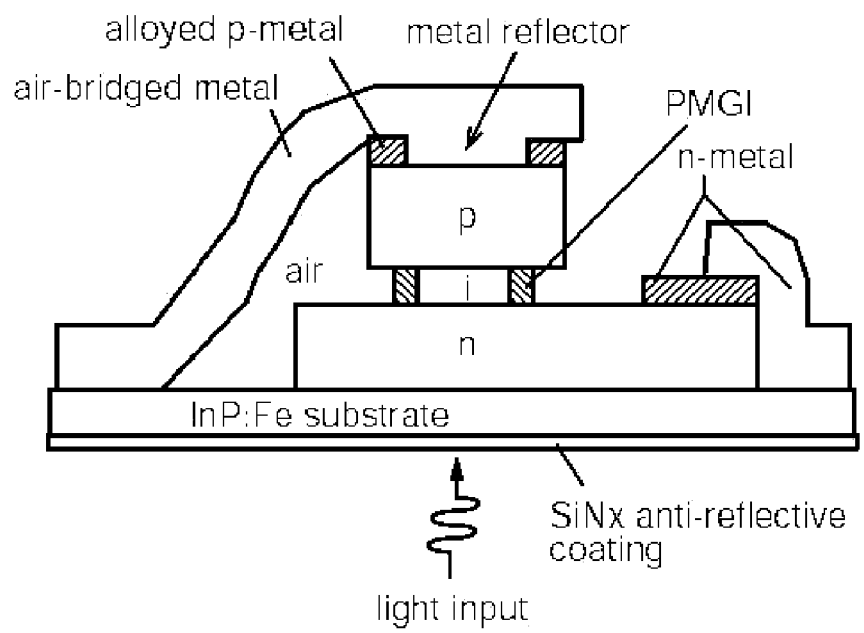

Indium phosphide (InP) based photodiodes especially of p-i-n type have been studied extensively over the last decade for its application in optical communication. These photodiodes are based on the structure and material system, which can detect the wavelengths covering from 1000 nm to 1600 nm. FIGS. 1A and 1B shows a cross-sectional view of prior art of photodiodes of top emitting and bottom type. In most cases a thin layer of InGaAs acting as the absorption region, is sandwiched between two layers of doped InP. These two materials (InGaAs and InP) combination used in the photodiode determine mainly photodiode's spectral detection region. Details of the prior art photodiode can be found in the chapter written by K. Taguchi, in the book, entitled "*WDM Technologies: Active Optical Components*" (Editor: A. K Dutta), published by Academic Press, Boston, Mass.

Figure 2A:
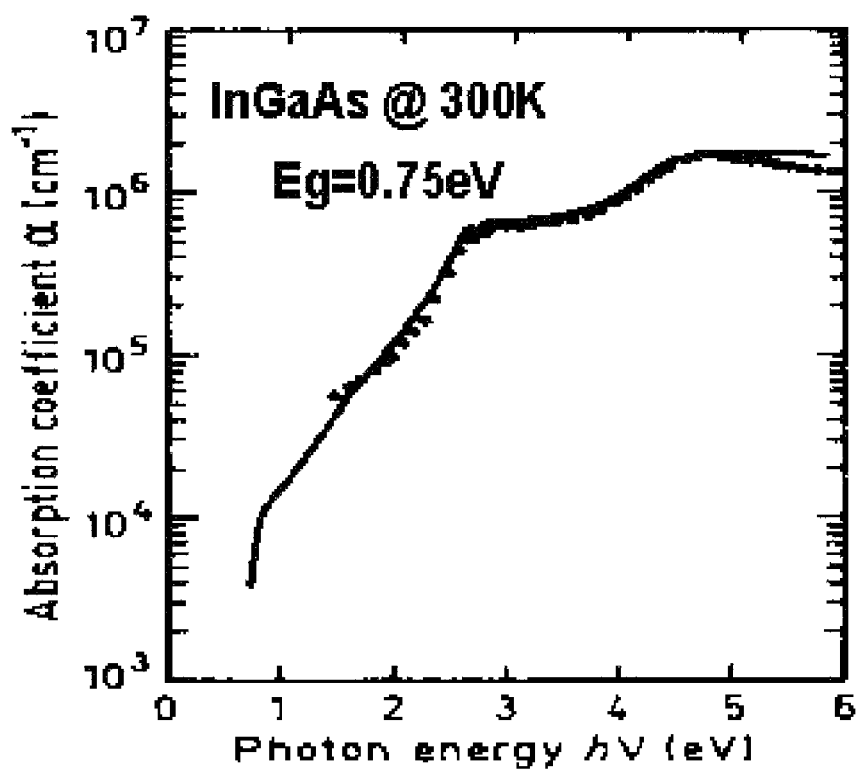
FIG. 2 is the absorption coefficient of FIG. 2A. InGaAs of bandgap (0.75 eV), and FIG. 2B. InP of bandgap 1.34 eV versus photon energies.
Figure 2B:
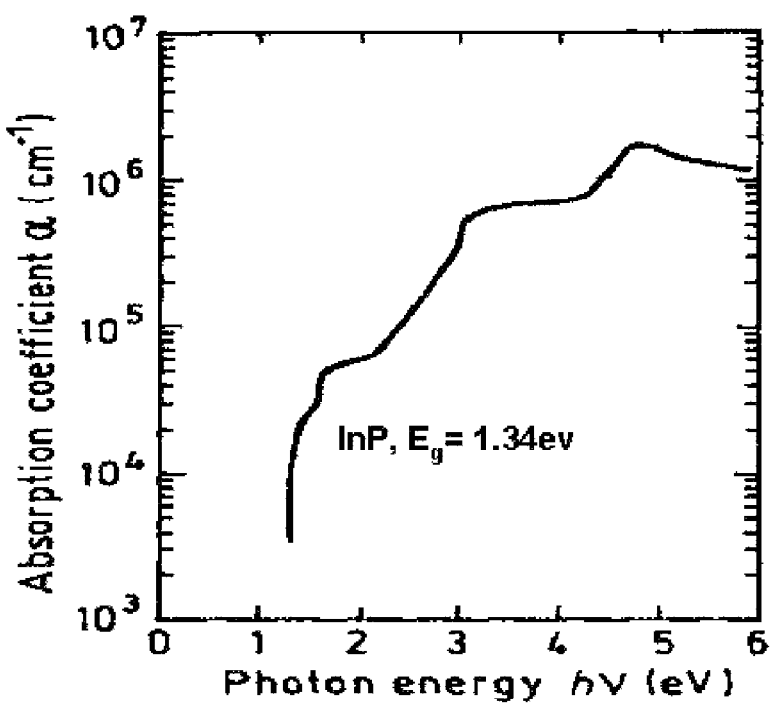

The absorption spectra of InGaAs (lattice matched to InP) and InP materials are shown in FIGS. 2A and 2B. The bandgaps of InGaAs and InP are 0.75 eV and 1.34 eV, which correspond to wavelengths of ~1650 nm and ~950 nm, respectively. The absorption coefficient of these material increases with increasing of photon energy. Any photodiode made using InGaAs as the active absorption layer is expected to absorb all the wavelengths from UV (ultraviolet) to 1650 nm unless some photons are selectively blocked.

After carefully looking at FIGS. 1 and 2, one can understand why conventional device structure as shown in FIGS. 1A and 1B cannot respond to any photon with a wavelength below 1000 nm. The reason is that the InP contact layer absorp the light of wavelengths below 950 nm. Any photon absorption in doped InP contact layers doesn't generate any electrical response in the device (if carrier diffusion is neglected). Thus, photodiodes in prior art are not suitable for broad spectral ranges covering from <300 nm to 1650 nm and also <300 nm to 2500 nm.

In the prior art (not shown here), a wafer bonding technique (not shown) is also usually used to design a photodetector with wide spectral response. In such devices, longer wavelengths are absorbed by a device structure shown in FIG. 1, while shorter wavelengths are detected by a Silicon photodiode, wafer bonded to an InP based structure. As the linear thermal expansion coefficient (TEC) of InP and Si are $4.60 \times 10^{-6}$ $C^{-1}$, and $2.6 \times 10^{-6} C^{-1}$, respectively, the TEC mismatches cause stress in a wafer-bonded structure in wide temperature ranges operation. In addition, making an array with a wafer bonded structure poses a great challenge in designing interconnect with the aim of addressing individual pixels.

If the photodiode structure consists of InGaAs (lattice matched to InP) as a absorption layer, and a ohmic contact layers which do not absorb significant number of photons, the photodiode can be used in wide spectral regions covering from UV to 1650 nm and also from UV to 2500 nm. In the presence invention, the photodiode structures are mentioned which could have broad spectral range detection varying from UV to 1650 nm and also UV to 2500 nm with high quantum efficiency and high frequency response. The detector can also be used for wide range of detection where InGaAs absorb. For example from 250 nm to 1700 nm spectral detection and also 250 nm to 2500 nm, can be possible using the photodetector mentioned here. For the sake of understanding, we explain separately the photodetectors (and their arrays) having the <300 nm to 1700 nm detection ranges and <300 nm to 2500 nm detection ranges. Also we explain the top-illuminated photodetector (photodetector on which light is illuminated from the top) and bottom-illuminated (photodetector on which light is illuminated from the bottom (substrate side)) type both detectors and their process.

A. Top-illuminated Type i) Photodetector (and its Array) Structure for <300 nm to 2500 nm Detection FIG. 3 shows the schematic showing the cross-sectional view of the photodetector having wide spectral detection ranges from <300 nm to 2500 nm in the third embodiment in accordance to the present invention, wherein the same numerals are the same parts so that repeated explanation is omitted here.

Figure 3:
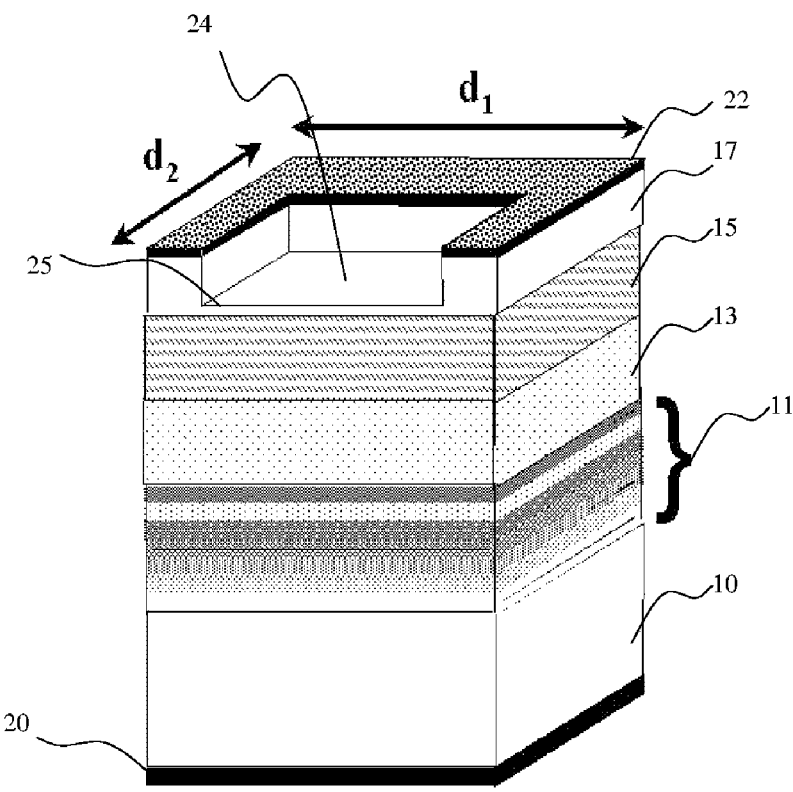
FIG. 3 is the schematic showing the cross-sectional view of a top-illuminated photodiode structure having the spectral responses from <300 nm to 2500 nm in the third embodiment in accordance to the present invention.
Figure 4:
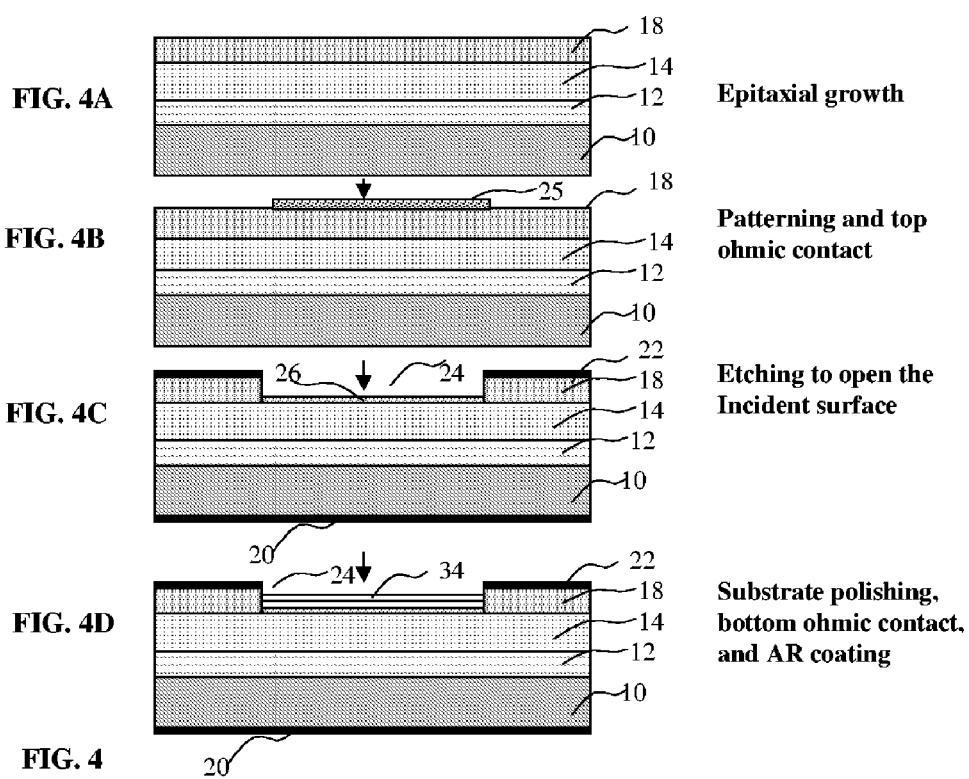
FIG. 4A to FIG. 4D is the schematics showing alternative fabrication process of the top-illuminated single photodiode in the sixth embodiment in accordance to the present invention.

Photodiode material layers structure as shown in FIG. 3, consists of n type InP substrate 10, n+ and low doped $InAs_yP_{1-y}$ buffer layers 11, $InAs_{0.6}P_{0.4}$ layer 13, $In_{0.8}Ga_{0.2}As$ layer 15 as absorption layer, highly doped $InAs_{0.6}P_{0.4}$ layer 17 for ohmic contact. Photodiode has the n type ohmic contact 20 at the backside of the substrate 10, and p type of ohmic contact 22 at the top of the photodiode. The photodiode has the opening incident surface 24 at the top for incident the light. A thin layer of recessed $InAs_{0.6}P_{0.4}$ 25 layer is left in the opening surface to extend the electrical field over the incident surface. The photodiode has the shape of rectangular or square having the width and length of $d_1$ and $d_2$, respectively. The width of the top ohmic contact 22 can have the 1 μm to 2 μm, appropriate for the ohmic contact using the standard photolithography technique. The details of this fabrication process will be explained later section. Using the nano-imprint (not shown), however, the width can be reduced to nanoscale level and incident surface area can be increased, and also the pixel size can be reduced.

According to this invention, the graded composition is used in between the $In_{0.8}Ga_{0.2}As$ 15 and InP substrate 10 to reduce the dark current. The absorption layer $In_{0.8}Ga_{0.2}As$ 15 could be intrinsic or slightly n doped layer. As the top ohmic contact layer, InGaAs or InP layer can be used. In the case of InP layer, the thickness is needed to be thin enough to reduce the absorption of the light in the shorter wavelength regions.

According to this invention, $InAs_{0.6}P_{0.4}$ layers 17 are used as the contact layer. If high doping of $InAs_{0.6}P_{0.4}$ appropriate for ohmic contact is not possible, a thin layer of highly doped InGaAs layer (not shown) can be used on the $InAs_{0.6}P_{0.4}$ layer 17.

The top ohmic contact (p-doped) InGaAs layer is made to thin close to ~10 nm or less to reduce the absorption and also reduce diffusion induced current. For 10 nm InGaAs thickness, the doped InGaAs thin layer will absorb less than 1% of the input power at 1650 nm wavelength and less than 5% at <300 nm wavelengths. Incorporating a thin spacer layer in between intrinsic absorption layer and p-ohmic contact layer will prevent the p-dopant from diffusing to absorption layer.

The absorption layer thickness could be 1 to 4 μm to increase the quantum efficiency with compromising with the frequency response. It is estimated that the photodiode with thick absorption layer of 3.5 μm $Ga_{0.47}In_{0.53}As$ that ensures a quantum efficiency (QE) of more than 90% at 1650 nm wavelength and much higher QE for shorter wavelengths as is suggested by FIG. 2(a).

In the preferred embodiment as shown in FIG. 3, the photodiode shape is shown to be square or rectangular, the shape can be also circular or ellipsometric, as necessary for the specific application. With using the similar approach, bottom incident type photodiode can also be designed. The photodiode can be 5 μm×5 μm with an opening of 3 μm×4 μm for receiving light. For using of the highly $p^{++}$ doped InGaAs layer, $In_{0.47}Ga_{0.53}As$ type with highly doped p- can be used. The p-ohmic contact is a thin ohmic contact on a highly doped InGaAs layer with a dopant concentration of >$10^{20}$/cm$^3$. The frequency response of the structure is estimated to be 8 GHz at 3 dB. The capacitance of the device is in the sub femto-Farad range due to the small junction area, and thick absorption layer. Overall frequency response is limited by the transit time response and the structure can easily operate above 5 GHz bandwidth at 3 dB with quantum efficiency greater than 90% for any wavelengths from <300 nm up to 1650 nm.

Alternatively, highly p-doped InP layer can also be used instead of highly p-doped $In_{0.47}Ga_{0.53}As$ on the top of the InGaAs absorption layer. The layer is to be made to thin to ~10 nm to suppress the InP absorption for the shorter wavelength light.

Each photodiode can have the junction area of below 5×5 μm$^2$ or more (square shaped) with receiving area of approximately 3×4 μm$^2$ after considering the electrode width. The circular or rectangular shaped electrode shape can also be thought for the same photodiode. On single substrate, photodiode array of N×N can be made, and each photodiode element is etched to substrate to isolate from other photodiode array. This would suppress the cross talk below <1%. The photodiode array is expected to offer high quantum efficiency high speed >3 GHz at 3 dB (considering the parasitic of metal line), and also can be used in a wide range of temperatures and wavelengths.

Each photodiode element of the proposed array can also be rapidly and randomly addressed based on the metal connection scheme. The metal connection can be made using the standard photolithography technique. The advantage of this photodiode array including metal connection is that it can be fabricated using the less process step than conventional CCD.

ii) Fabrication Process a. Single Photodetector

FIGS. 4A to 4D are the schematics showing the fabrication process of the single photodiode element in accordance to the present invention wherein the same parts are represented by the same numerals so that repeated explanation is omitted here. This fabrication process described here is only for example. The required buffer InP layer 12, absorption layer InGaAs 14, and high doped InGaAs layer 18 are deposited on the substrate 10 using standard deposition techniques such as chemical vapor deposition, molecular beam epitaxial technique etc. Noted that, required spacer layer (not shown) avoiding the doping diffusion into the absorption layer may require. Patterning and subsequent dry etching would open the incident surface 24. The thin layer 26 of InGaAs is kept left, and its thickness is designed to reduce the absorption of the light, and also to distribute the electrical field uniformly over the incident surface. Metallization for bottom and top ohmic contacts 20 and 22 are made, which is followed by formation of the AR coating 34 on the front surface.

b. Photodetector Array

Figure 5A:
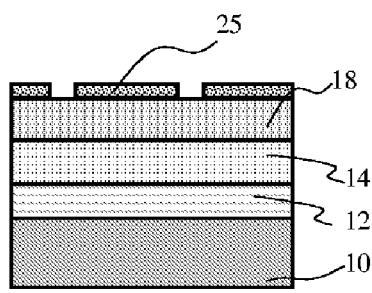
FIGS. 5A to 5D is the schematics showing the cross-sectional views of the fabrication process for the top-illuminated photodiode array in the eighth embodiment in accordance to the present invention.
Figure 5C:
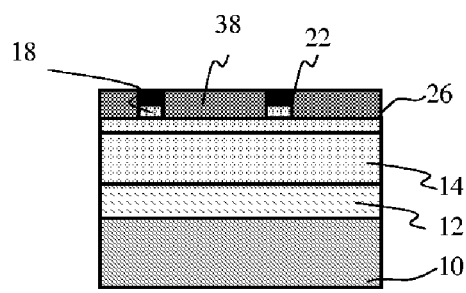
Figure 5B:
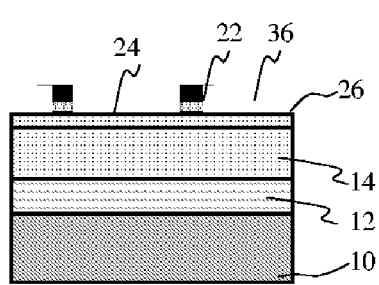
Figure 5D:
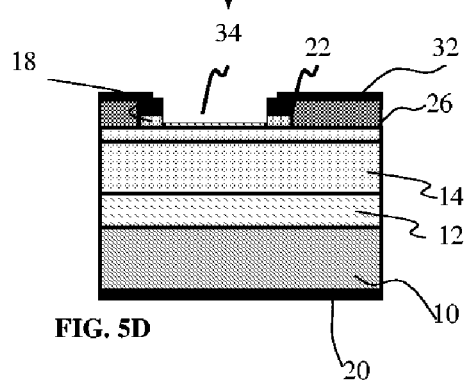
Figure 6A:
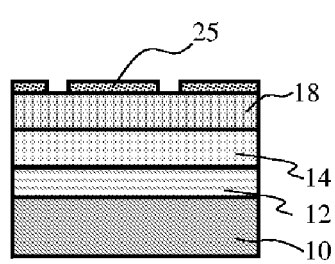
FIGS. 6A to 6E is the schematics showing the cross-sectional views of the fabrication process for the top-illuminated photodiode array in the tenth embodiment in accordance to the present invention.
Figure 6D:
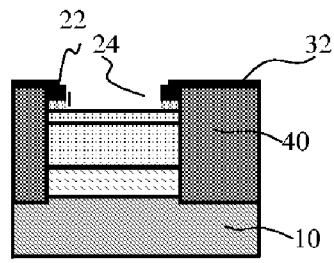
Figure 6B:
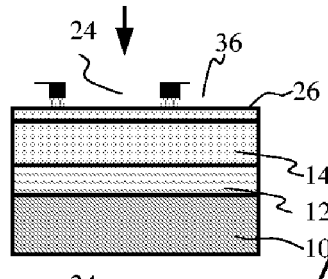
Figure 6E:
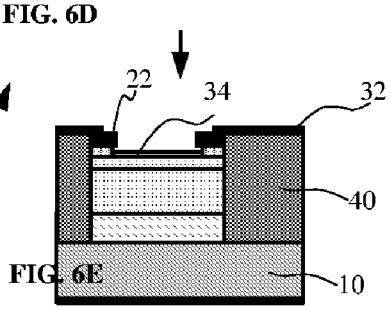
Figure 6C:
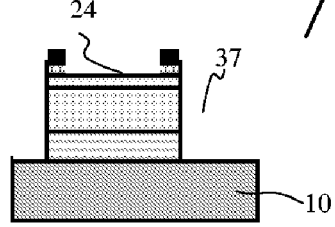

FIGS. 5A to 5B are the schematics showing the cross-sectional views of the alternate fabrication process of the photodiode array, wherein the like part is represented by the like numeral, so that repeated explanation is omitted here. In the preferred embodiment, the pitch and photodiode element size in the array are selected based on the quantum efficiency, speed, and detection resolution. In the preferred embodiment, after patterning of 25, formation of the ohmic contact 22 for N×N array is done. This is followed by the dry etching of portion of the top layer to open the incident surface portion 24, and the space between the photodiode element 36 are done. After top metallization for ohmic contact 22, dielectric layer 38 deposition and subsequent planarization is required to draw the metal line on the top of the surface. For planarization, standard chemical mechanical polishing (CMP) can be used. Required patternization, and subsequent metallization for the metal line 32 are required. Following polishing (not shown) and mettallization for ohmic contact 20 at the backside of the substrate, AR coating 34 is done. Noted here that additional processes (not shown) (a) for etching out the dielectric layer from the incident surface, and (b) for etching more deeper down to the high resistive absorption layer to isolate the each photodiode from each other. In the preferred embodiment, standard etching process such as reactive ion beam etching (RIBE) or reactive ion etching (RIE) technique can be used. Wet etching technique can also be used instead of the dry-etching.

FIGS. 6A to 6E are the schematics showing the cross-sectional views of the alternate fabrication process of the photodiode array, in the tenth embodiment, wherein the like part is represented by the like numeral, so that repeated explanation is omitted here. In the preferred embodiment, after patterning of 25, formation of the ohmic contact 22 for N×N array is done. This is followed by the dry etching of portion of the top layer to open the incident surface portion 24. Afterwards, patterning and subsequent dry etching the layers up to the substrate surface outside each photodetector 37 to isolate electrically each photodiode element from each other. The process after this is same as that of FIG. 5, so that repeated explanation is omitted here. In the preferred embodiment, standard etching process such as reactive ion beam etching (RIBE) or reactive ion etching (RIE) technique can be used. Wet etching technique can also be used instead of the dry-etching.

In the preferred embodiment, photodiode structure (for <300 nm to 2500 nm detection) consisting of the InP substrate, InAsP buffer layer, and InGaAs absorption layer, and InGaAs doping layer are shown. However, this covers all kinds of InGaAs (single or multiple layers having different bandgaps), covering the broad spectral ranges detector. In addition, instead of using the InAsP as the contact layer, highly doped InGaAs (not shown) can also be used. Alternately, thin layer of highly doped InGaAs (not shown) can be used on the top of the doped InAsP layer for the ohmic contact. Alternatively, the combination of the highly doped InAsP and high doped InGaAs layers (not shown) can also be used as the contact layer.

Alternatively, photodiode (<300 nm to 1700 nm) structure consists of the InP substrate, buffer layer, and InGaAs absorption layer, and InGaAs doping layer. In addition, instead of using the InGaAs as the doping layer, highly doped InAlAs (not shown) can also be used. In this case, the graded layer can be incorporated in the structure to reduce the minority carrier trapping at the InAlAs—InGaAs band edge discontinuity. Alternatively, the combination of the highly doped InAlAs and high doped InGaAs layers (not shown) can also be used as the contact layer.

B. Bottom-Illuminated Type i) Detector Structure a. Single Photodetector Structure for <300 nm to 1700 nm Detection FIG. 7A is the schematic showing the cross-sectional view of the bottom-illuminated single photodetector having spectral detection ranges from <300 nm to 1700 nm in accordance to the present invention. Photodiode structure as shown in FIG. 7A, consists of n type InP substrate 10, single thin n+ InP buffer layer or combination of the InP and InGaAs layers (not shown) 42, InGaAs absorption layer 14, spacer layer of InGaAs layer or low doped InP 16, highly doped InP or InGaAs ohmic contact layer 18. Photodiode has the n type ohmic contact 20b at the backside of the substrate 10, and p type of ohmic contact 22b at the top of the photodiode. The photodiode has the opening incident surface 44 at the bottom for illuminating the light 46. The substrate is etched-off to open the incident surface 44. A thin layer of the InP 42 is layer is left underneath the opening surface to extend the electrical field over the incident surface. The anti-reflection coating 34b can be formed on the incident surface to reduce the reflection loss of the incident light. The photodiode has the shape of rectangular or square having the width and length of $d_1$ and $d_2$, respectively (not shown). The width of the top ohmic contact 22b can have the 1 µm to 2 µm, appropriate for the ohmic contact using the standard photolithography technique. The details of this fabrication will be explained later section.

FIG. 7B is the schematic showing the cross-sectional view of the bottom-illuminated single photodetector having spectral detection ranges from <300 nm to 1700 nm in accordance to the present invention, wherein the same numerals represents the same parts so that repeated explanation is omitted here. The photodiode structure is same as that of the photodetector structure as explained in FIG. 7A. Only difference is that the bottom electrode 20c (which can be an n-type ohmic contact) is taken out monolithically from the top for the easiness in the bonding. The details of this fabrication will be explained later section.

According to this invention, the bottom ohmic contact (n-doped) InP or combination of InGaAs and InP layers 42 is made to thin close to ~10 nm or less to reduce the absorption and also reduce diffusion induced current. For 10 nm InGaAs thickness, the doped InGaAs thin layer will absorb less than 1% of the input power at 1650 nm wavelength and less than 5% at <300 nm wavelengths. Incorporating a thin spacer layer 16 in between intrinsic absorption layer and p-ohmic contact layer 18 will prevent the p-dopant from diffusing to absorption layer.

The absorption layer thickness could be 1 to 5 µm to increase the quantum efficiency with compromising with the frequency response. It is estimated that the photodiode with thick absorption layer of 3.5 µm $Ga_{0.47}In_{0.53}As$ that ensures a quantum efficiency (QE) of more than 90% at 1650 nm wavelength and much higher QE for shorter wavelengths as is suggested by FIG. 2A.

In the preferred embodiment as shown in FIG. 7A, the photodiode shape is shown to be square or rectangular, the shape can be also circular or ellipsometric, as necessary for the specific application. The photodiode junction area can be made to below 5 µm.×5 µm. For using of the highly $p^{++}$ doped InGaAs layer, $In_{0.47}Ga_{0.53}As$ type with highly doped p– can be used. Dopant concentration of $>10^{20}/cm^3$ can be grown. For the case of $p^{++}$ InP as the contact layer, dopant concentration as high as $>10^{21}/cm^3$ can be possible. The frequency response of the structure is estimated to be 8 GHz at 3 dB. The capacitance of the device is in the sub femto-Farad range due to the small junction area, and thick absorption layer. Overall frequency response is limited by the transit time response and the structure can easily operate above 5 GHz bandwidth at 3 dB with quantum efficiency greater than 90% for any wavelengths from <300 nm up to 1700 nm.

Alternatively, highly n-doped InGaAs layer can also be used instead of highly n-doped $In_{0.47}Ga_{0.53}As$ on the top of the InP substrate and also bottom of the InGaAs absorption layer. The layer is to be made to thin to ~10 nm to suppress absorption for the shorter wavelength light.

b. Single Photodetector Structure for <300 nm to 2500 nm Detection

Figure 8A:
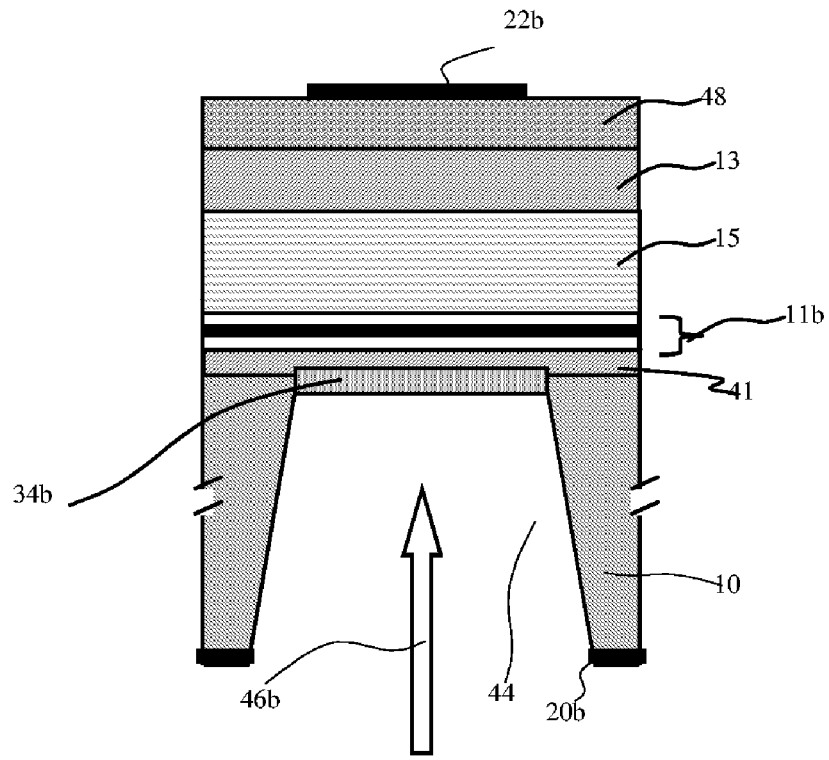
FIGS. 8A and 8B are the schematics showing the cross-sectional view of back-illuminated photodiode structures having the spectral responses from <300 nm to 2500 nm in the twelfth embodiment in accordance to the present invention.

FIG. 8A shows the schematic showing the cross-sectional view of the bottom-illuminated photodetector having wide spectral detection ranges from <300 nm to 2500 nm in accordance to the present invention, wherein the same numerals are the same parts so that repeated explanation is omitted here. Photodiode material layers structure as shown in FIG. 8A, consists of n type InP substrate 10, thin n+ InP 41 and low doped $InAs_yP_{1-y}$ buffer layers 11b, $In_{0.8}Ga_{0.2}As$ layer 15 as absorption layer, $InAs_{0.6}P_{0.4}$ layer 13, and highly doped InP 48 for ohmic contact. Photodiode has the n type ohmic contact 20b at the backside of the substrate 10, and p type of ohmic contact 22b at the top of the photodiode. The photodiode has the opening incident surface 44 at the top for incident the light.

Figure 8B:
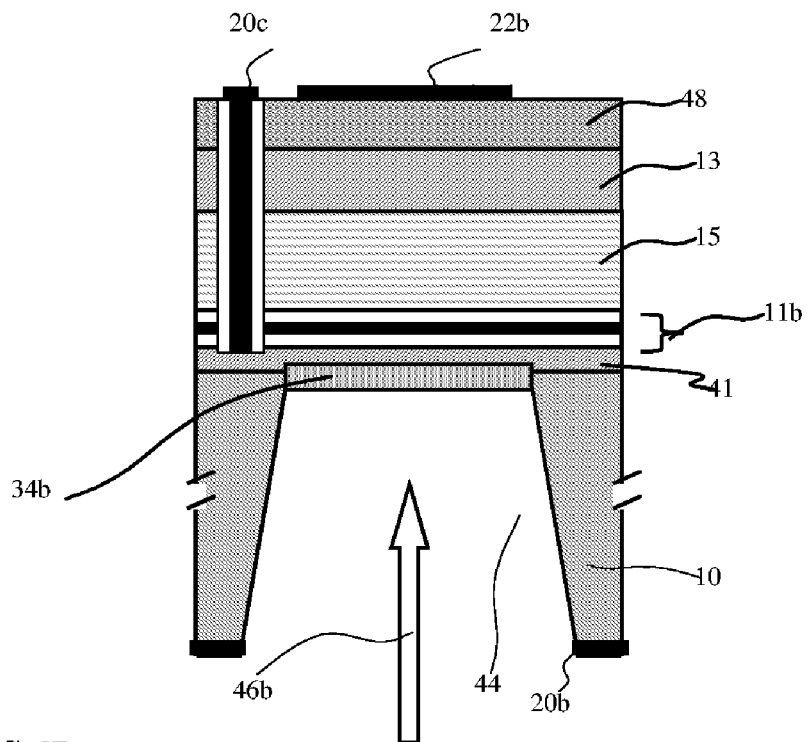

FIG. 8B is the schematic showing the cross-sectional view of the bottom-illuminated single photodetector having spectral detection ranges from <300 nm to 2500 nm in accordance to the present invention, wherein the same numerals represents the same parts so that repeated explanation is omitted here. The photodiode structure is same as that of the photodetector structure as explained in FIG. 8A. Only difference is that the bottom electrode 20c is taken out monolithically from the top for the easiness in the bonding. The details of this fabrication will be explained later section.

According to this invention, instead of using $InAs_{0.6}P_{0.4}$ layer 13, combination of $InAs_{0.6}P_{0.4}$ and $InAs_yP_{1-y}$, and/or their graded composition layers (not shown) can be used. Again, instead of using highly doped InP 48, or combination of high doped $InAs_{0.6}P_{0.4}$ layer and high doped InP or only highly doped $InAs_{0.6}P_{0.4}$ layer (not shown) can be used as the contact layer. If high doping of $InAs_{0.6}P_{0.4}$ appropriate for ohmic contact is not possible, a thin layer of highly doped InP layer as the contact layer (not shown) can also be used on the top of high doped $InAs_{0.6}P_{0.4}$. The absorption layer $In_{0.8}Ga_{0.2}As$ 15 could be intrinsic or slightly n doped layer.

According to this invention, a thin layer of etch stopper (not shown) can be used prior to forming thin layer of InP 41. The thickness of the thin layer of InP 41 (including etch stopper, if any) has to be selected to extend the electrical field over the incident surface. The photodiode has the shape of rectangular or square having the width and length of $d_1$ and $d_2$, respectively. The width of the top ohmic contact 22b can have the 1 µm to 2 µm, appropriate for the ohmic contact using the standard photolithography technique. The details of this fabrication process will be explained later section.

c. Photodetector Array Structure

FIG. 9A shows the schematic showing the cross-sectional view of the bottom-illuminated photodetector array having wide spectral detection ranges in accordance to the present invention, wherein the same numerals are the same parts so that repeated explanation is omitted here. Photodiode material layers structure as shown in FIG. 9A, which consists of n type InP substrate 10 and the photodiode structure 50 as mentioned in FIG. 7 or 8. Photodiode has the common n type ohmic contact 20b taken from bottom of the substrate 10. The p type of ohmic contact forms the individual pixel 52 independent with each other at the top of the photodiode. The photodiode has the opening incident surface 44 at the bottom of the substrate opened for incident the light 47. The interconnect line 54 from each pixel is laid on the insulator layer 56 to connect each pixel (each photodiode element) to the outside pad. There could be many ways to bond the array of photodiode 58. One example is shown in FIG. 9A. A thin layer of the insulator 60 can be used to make easiness in the bonding with the glass slab or insulator sheet 62 which cover the expose portion of the pixels. The antireflection coating 64 is used to reduce the reflection and increase the sensitivity.

FIGS. 9B and 9C are the schematic showing the cross-sectional view of the bottom-illuminated photodetector array having wide spectral detection ranges in accordance to the present invention, wherein the same numerals represents the same parts so that repeated explanation is omitted here. The photodiode structure is same as that of the photodetector structure as explained in FIG. 9A. Only difference in both FIGS. 9B and 9C are that the no bonding flat insulator is used on the top electrode, in the case of FIG. 9C, the direct bonding of the pixel 52 can be done.

FIGS. 10A, 10B, and 10C show the schematics showing the cross-sectional views of the bottom-illuminated photodetectors array having wide spectral detection ranges in accordance to the present invention, wherein the same numerals are the same parts so that repeated explanation is omitted here. Photodiode structure 50 is the same as that of shown in FIG. 9. Only differences in FIG. 10 are that, in order to reduce the cross-talk, each pixel is etched down so that photocurrent can't be followed to the neighborhood pixel. Also, to make easiness in the bonding, insulating layer 66 is used. Other is the same as that of FIG. 9, so that repeated explanation is omitted here.

Figure 11A:
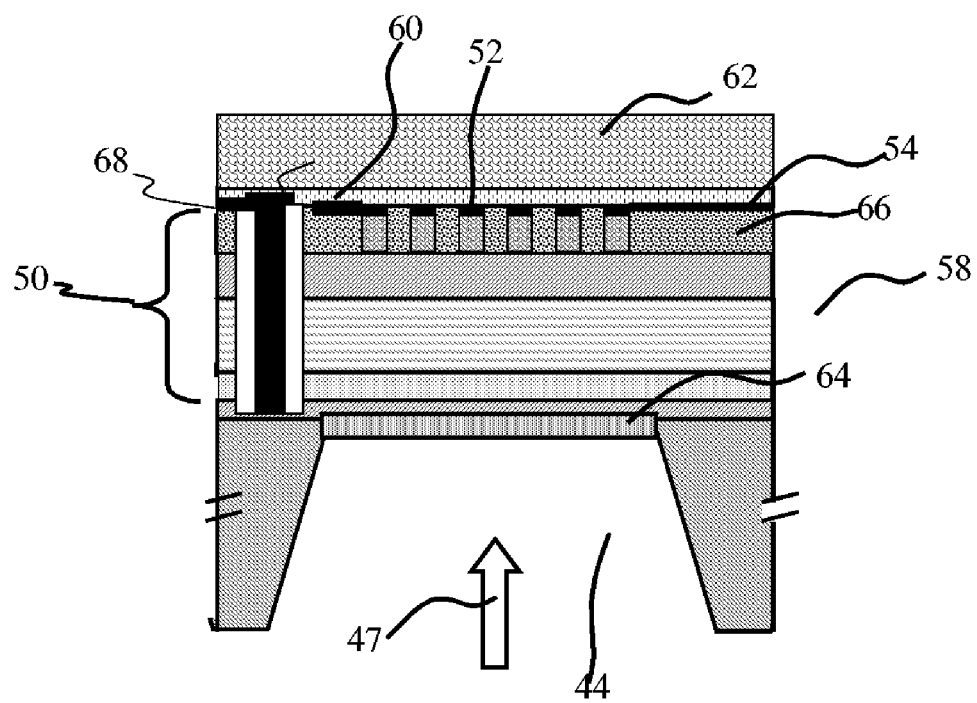
Figure 11B:
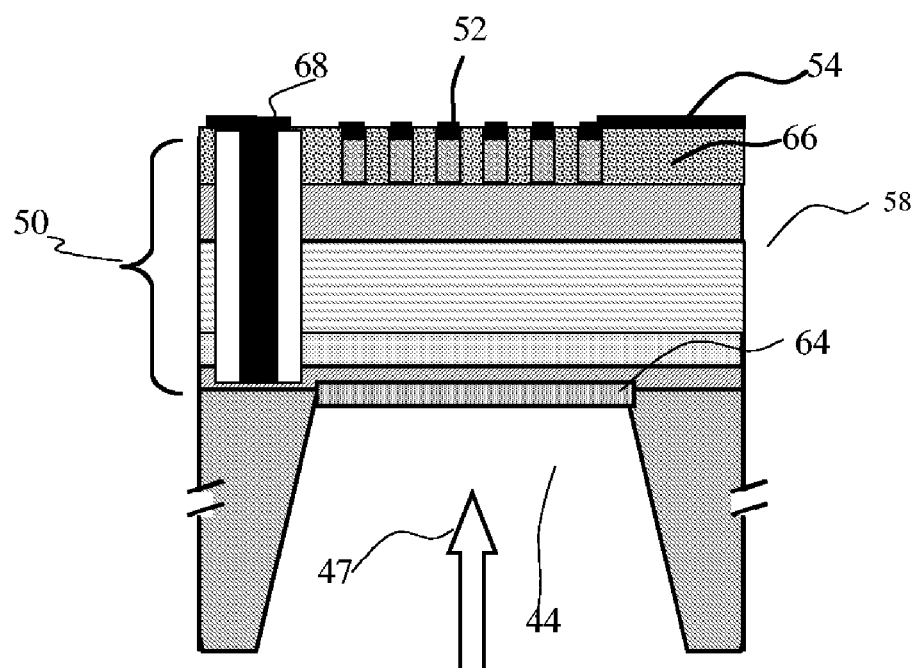
Figure 20C:
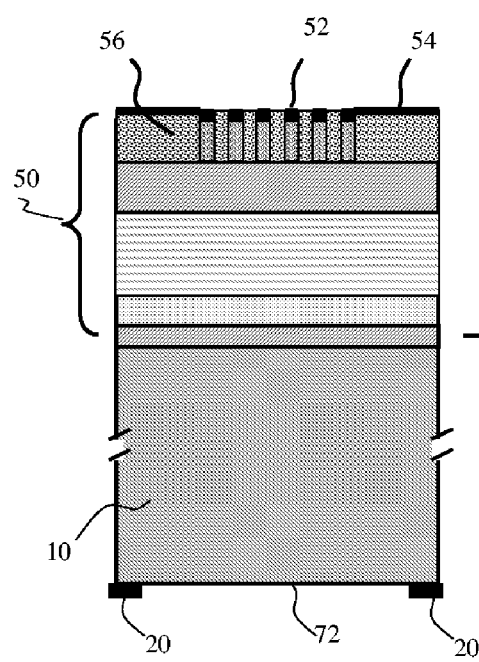
Figure 20D:
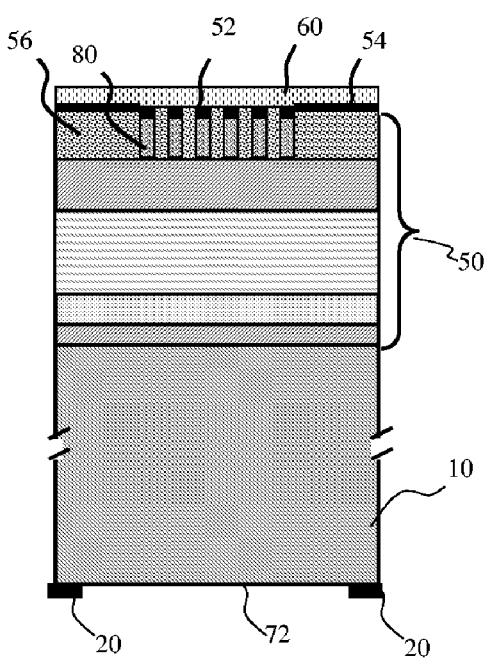
Figure 20E:
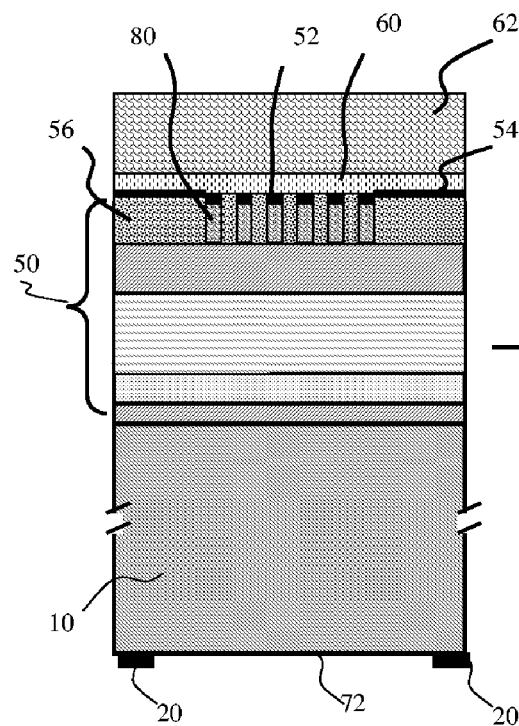
Figure 20F:
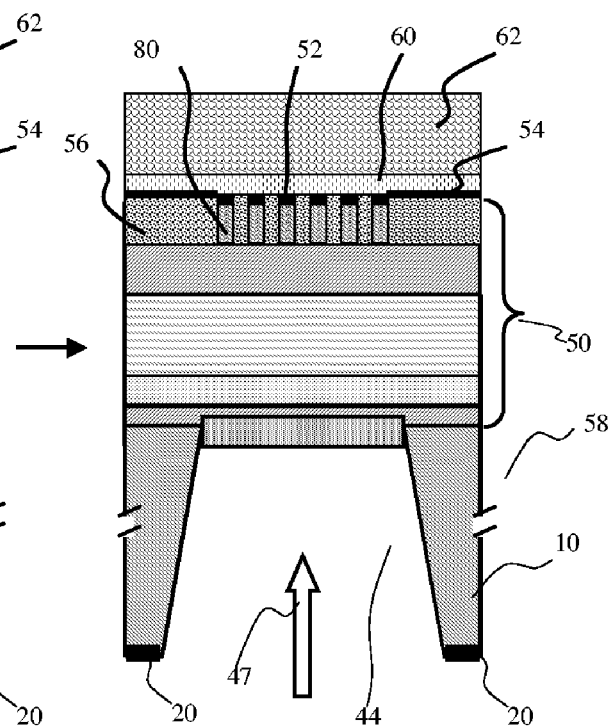
Figure 21A:
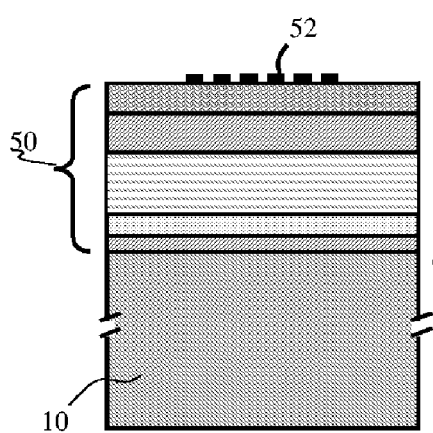
Figure 21B:
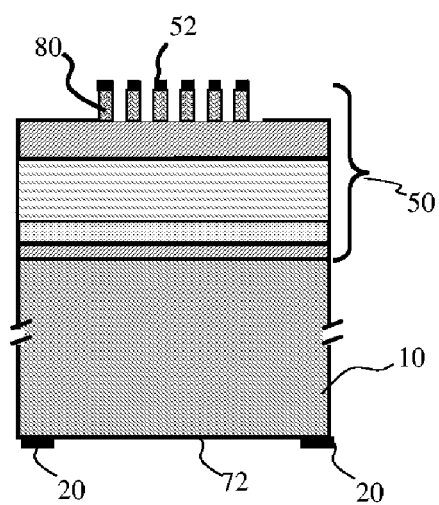
Figure 21C:
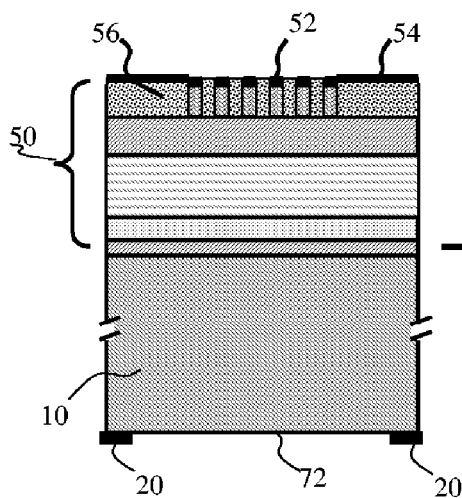
Figure 21D:
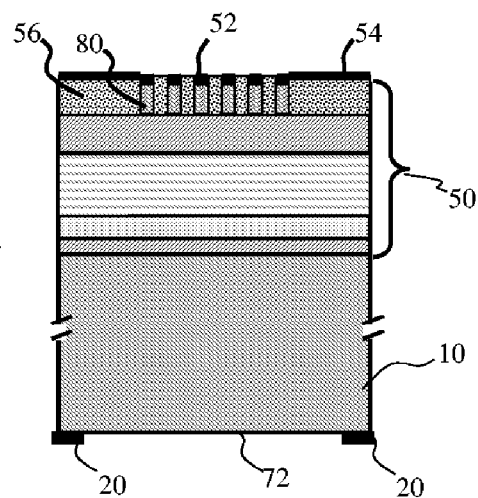
Figure 22C:
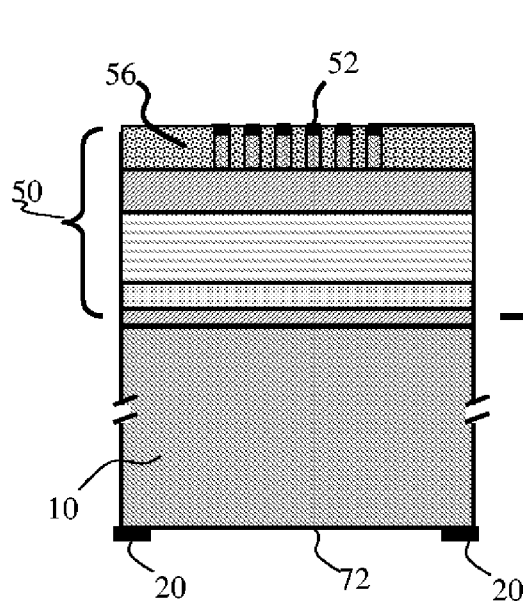
Figure 22D:
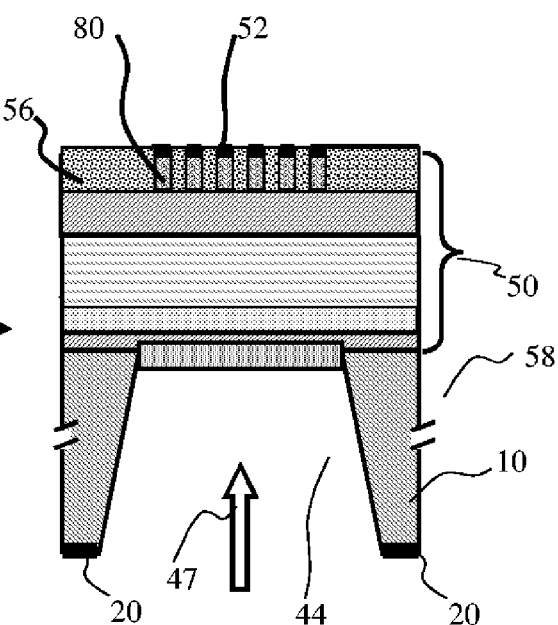
Figure 23A:
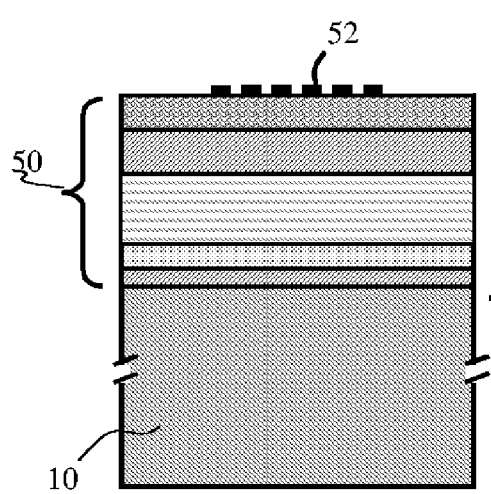
Figure 23B:
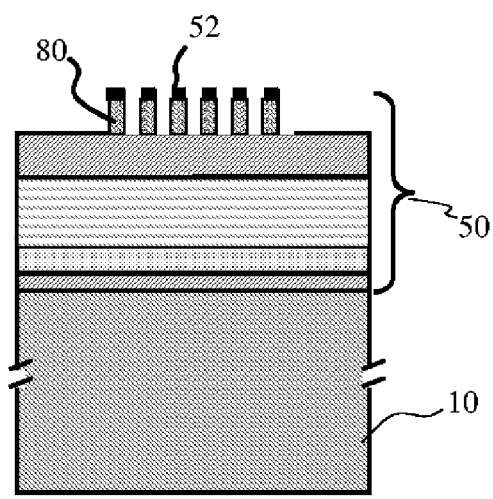
Figure 25A:
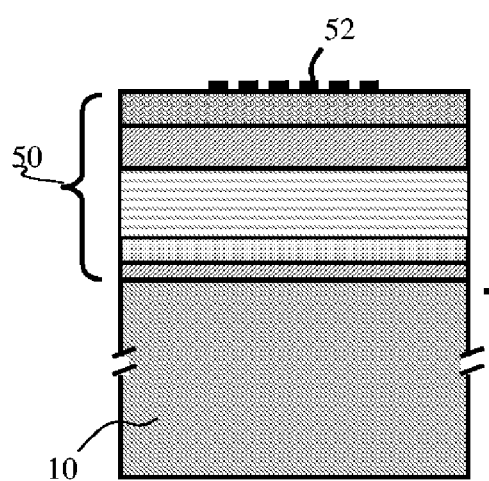
Figure 25B:
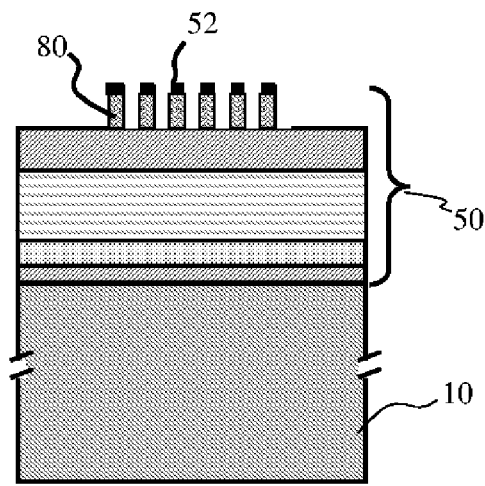
Figure 25C:
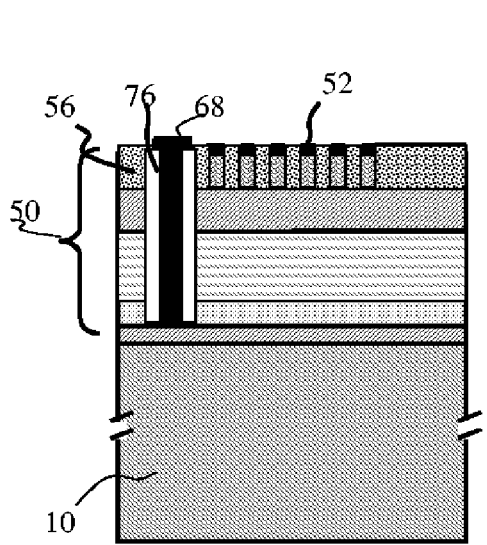
Figure 25D:
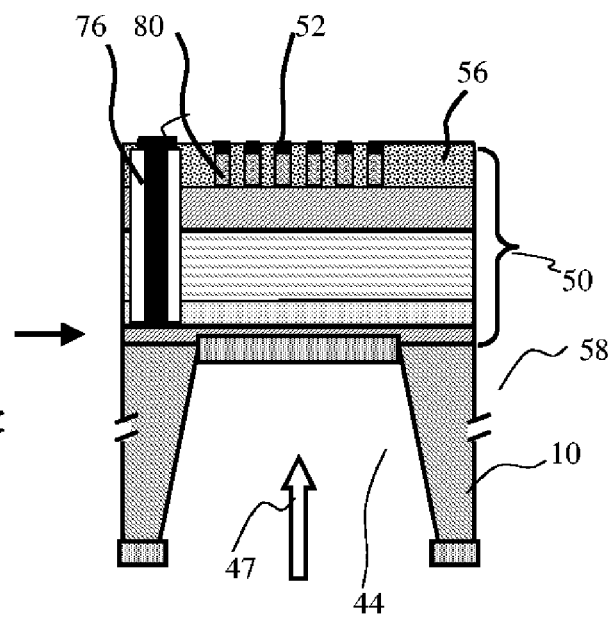

FIGS. 11A, 11B, and 11C show the schematics showing the cross-sectional views of the bottom-illuminated photodetectors array having wide spectral detection ranges in accordance to the present invention, wherein the same numerals are the same parts so that repeated explanation is omitted here. Photodiode structure 50 is the same as that of shown in FIG. 10. Only differences in FIG. 11 are that, the bottom electrode 68 (which can be an n-type ohmic contact) has been taken out from top. Other is the same as that of FIG. 10, so that repeated explanation is omitted here.

ii) Fabrication Process a. Single Element

FIGS. 12A to 12D are the schematics showing the fabrication process of the single photodiode element in accordance to the present invention wherein the same parts are represented by the same numerals so that repeated explanation is omitted here. The fabrication process mentioned herewith will be the same for all detector structure for both broadband structures, mentioned earlier, only difference are the type of materials. We explain the fabrication of one structure, similar fabrication process can be used for the other structure.

This fabrication process described here is only for example. The detector structure 50 is deposited on the substrate 10 using standard deposition techniques such as chemical vapor deposition, molecular beam epitaxial technique etc. One after another, Patterning and subsequent metallization made the top electrode 70 and bottom electrode 20, and open the incident surface 72 at the bottom surface of the substrate 10. The bottom substrate is etched or thinned out to open the incident surface 44. Standard wet-etching technique can be used to etch out the substrate to open the incident surface. The antireflection coating can be used at the bottom surface to enhance the quantum efficiency or the sensitivity.

FIGS. 13A to 13D are the schematics showing the fabrication process of the single photodiode element in accordance to the present invention wherein the same parts are represented by the same numerals so that repeated explanation is omitted here. After making the top electrode 70, other substrate contact 68 is made on the top after making the etching the detector structure to expose to the substrate or buffer layer (not shown). Insulator deposition 76 not to connect with the detector structure and subsequent etching and metallization will make the contact 68. Several process steps consisting of the patterning, etching, deposition and metallization are necessary to make the substrate contact 68 taken on the top. The patterning and subsequent etching or thinning out the substrate to open the incident area 44 follows this. Other process step from here is same as explained earlier, so that repeated explanation will be omitted here.

b. Array

FIGS. 14A to 14E are the schematics showing the fabrication processes of the single photodiode array independently addressable in accordance to the present invention wherein the same parts are represented by the same numerals so that repeated explanation is omitted here. After the detector structure 50 grown on the substrate, the top electrode 52 to define each pixel is formed following patterning, metallization and etching. The dielectrics (or insulating) layer 56 is deposited and subsequent polishing using chemical mechanical polishing (CMP) process leave the flat surface with exposing of each metal contact 52 for each pixel. Following this, the bottom common electrode 20 for the array is formed after metallization. Subsequent patterning and etching would open the area 72 to etch-out the substrate for opening the incident surface. The interconnection 54 is made to connect each pixel to the outside after metallization and following patterning and etching. The lift-off process can also be used to make the interconnection 54. A thin layer of the insulating layer 60 (which could be oxide layer or nitride layer etc.) is deposited on the top surface, and this I followed by the quartz or flat substrate attachment to make the whole in packaging. Finally, the etching or thinning out of the substrate to open the incident area 44 for the light 47.

According to this invention, the fabrication process has been explained as a part of the example. The fabrication steps should not be in necessary as described. The order for the fabrication step can be changed.

FIGS. 15A to 15D are the schematics showing the fabrication processes of the single photodiode array independently addressable in accordance to the present invention wherein the same parts are represented by the same numerals so that repeated explanation is omitted here. The fabrication process as shown in FIG. 15 is almost the same as that of explained in FIG. 14. Only differences are that the processes for thin layer insulator deposition and flat substrate attachment are not necessary. Other are same as explained in FIG. 14, so that repeated explanation is omitted here.

FIGS. 16A to 16C are the schematics showing the fabrication processes of the single photodiode array independently addressable in accordance to the present invention wherein the same parts are represented by the same numerals so that repeated explanation is omitted here. The fabrication process as shown in FIG. 16 is almost the same as that of explained in FIGS. 14 and 15. Only differences are that the photodiode array in the FIG. 16 can be directly bonded to the carrier (not shown). The thin layer of the dielectrics 60 and the flat substrate 62 attachments as necessary in FIG. 14 and the interconnection 54 as shown in FIGS. 14 and 15, are not necessary. Other fabrication process already explained in FIGS. 14 and 15, so that repeated explanation is omitted here.

FIGS. 17A to 17E are the schematics showing the fabrication processes of the single photodiode array independently addressable in accordance to the present invention wherein the same parts are represented by the same numerals as shown in FIGS. 13 and 14 so that repeated explanation is omitted here. The fabrication process is almost same as that of FIG. 14. Only differences are that the bottom electrode is not formed at the back-side of the substrate, so that related process is not necessary here. After the top pixel contact is formed, the substrate contact 68 is made as explained in FIG. 13, so that repeated explanation is omitted here. Final step could be patterning at the back-side of the substrate to open the etch-out portion for incident area.

FIGS. 18A to 18D are the schematics showing the fabrication processes of the single photodiode array independently addressable in the twenty-second embodiment in accordance to the present invention wherein the same parts are represented by the same numerals so that repeated explanation is omitted here. The fabrication process as shown in FIG. 18 is almost the same as that of explained in FIG. 17. Only differences are that the thin layer insulator and flat substrate attachment is not necessary. The repeated explanation is omitted here.

FIGS. 19A to 19C are the schematics showing the fabrication processes of the single photodiode array independently addressable in accordance to the present invention wherein the same parts are represented by the same numerals so that repeated explanation is omitted here. The fabrication process as shown in FIG. 19 is almost the same as that of explained in FIGS. 17 and 18. Only differences are that the photodiode array in the FIG. 19 can be directly bonded to the carrier (not shown). The thin layer of the dielectrics 60 and the flat substrate 62 attachments as necessary in FIG. 17 and the interconnection 54 as shown in FIGS. 17 and 18, are not necessary. The fabrication process already explained in FIGS. 17 and 18, so that repeated explanation is omitted here.

FIGS. 20A to 20F are the schematics showing the fabrication processes of the single photodiode array independently addressable in accordance to the present invention wherein the same parts are represented by the same numerals so that repeated explanation is omitted here. After the detector structure 50 grown on the substrate, the top electrode 52 to define each pixel is formed following patterning, metallization and etching. The fabrication process is same as that of explained in FIG. 14. Only differences are that after making the top metal contact, which makes the individual pixel, top surrounding high doped semiconductor layer (for ohmic contact) is etched out to reduce the crosstalk. Standard dry-etching process can be used. Based on the pitch, wet etching can also be used to etch out surrounding portion outside the pixel. The layer 80 left under each pixel could be high doped layer or more deep etching below high doped layer can be done, which would prevent to spread the field outside each pixel and thereby reduces the cross-talk. Following this, dielectric layer 56 is deposited to cover the etched area. The dielectrics are thicker than what is necessary in FIG. 14. After this, the fabrication process will be the same as that of explained in FIG. 14, so that repeated explanation is omitted here.

According to this invention, the fabrication process has been explained as a part of the example. The fabrication steps should not be in necessary as described. The order for the fabrication step can be changed.

FIGS. 21A to 21E are the schematics showing the fabrication processes of the single photodiode array independently addressable in accordance to the present invention wherein the same parts are represented by the same numerals so that repeated explanation is omitted here. The fabrication process as shown in FIG. 21 is same as that of explained in FIG. 20. Only differences are that the process for the thin layer insulator deposition and flat substrate attachment is not necessary. Other is same as explained in FIGS. 14 and 20, so that repeated explanation is omitted here.

FIGS. 22A to 22D are the schematics showing the fabrication processes of the single photodiode array independently addressable in accordance to the present invention wherein the same parts are represented by the same numerals so that repeated explanation is omitted here. The fabrication process as shown in FIG. 22 is almost the same as that of explained in FIGS. 20 and 21. Only differences are that the photodiode array in the FIG. 22 can be directly bonded to the carrier (not shown). The thin layer of the dielectrics 60 and the flat substrate 62 attachments as necessary in the process explained in FIG. 20 and the interconnection 54 as shown in FIGS. 20 and 21, are not necessary. Other fabrication process is already explained in FIGS. 14, 15, 20 and 21, so that repeated explanation is omitted here.

FIGS. 23A to 23F are the schematics showing the fabrication processes of the single photodiode array independently addressable in accordance to the present invention wherein the same parts are represented by the same numerals as shown in FIGS. 13 and 14 so that repeated explanation is omitted here. The fabrication process is almost same as that of FIGS. 14 and 20. Only differences are that the bottom electrode is not formed at the back-side of the substrate, so that related process is not necessary here. After the top pixel contact formed, the substrate contact 68 is made as explained in FIG. 13, repeated explanation is omitted here. Final step could be patterning at the back-side of the substrate to open the etchout portion for incident area.

FIGS. 24A to 24D are the schematics showing the fabrication processes of the single photodiode array independently addressable in accordance to the present invention wherein the same parts are represented by the same numerals so that repeated explanation is omitted here. The fabrication process as shown in FIG. 24 is almost the same as that of explained in FIGS. 14 and 20. Only differences are that the processes for thin layer insulator deposition, and flat substrate attachment are not necessary. Other is same as explained in FIGS. 14 and 20, so that repeated explanation is omitted here.

FIGS. 25A to 25D are the schematics showing the fabrication processes of the single photodiode array independently addressable in accordance to the present invention wherein the same parts are represented by the same numerals so that repeated explanation is omitted here. The fabrication process as shown in FIG. 25 is almost the same as that of explained in FIGS. 23 and 24. Only differences are that the photodiode array in the FIG. 25 can be directly bonded to the carrier (not shown). The thin layer of the dielectrics 60 and the flat substrate 62 attachment and the interconnection 54 are not necessary. The fabrication process already explained in FIGS. 17, 18, 20 and 23, so that repeated explanation is omitted here.

iii) Bonding Process

In previous sections, structure and fabrication process of the broadband band detector (single and array) are explained. This section covers the bonding process for the broadband detector according to this invention. For simplicity in explanation, we consider here broadband detector array having both contacts on the top. Similar bonding process can be used for all detector structures mentioned in this invention.

Figure 26A:
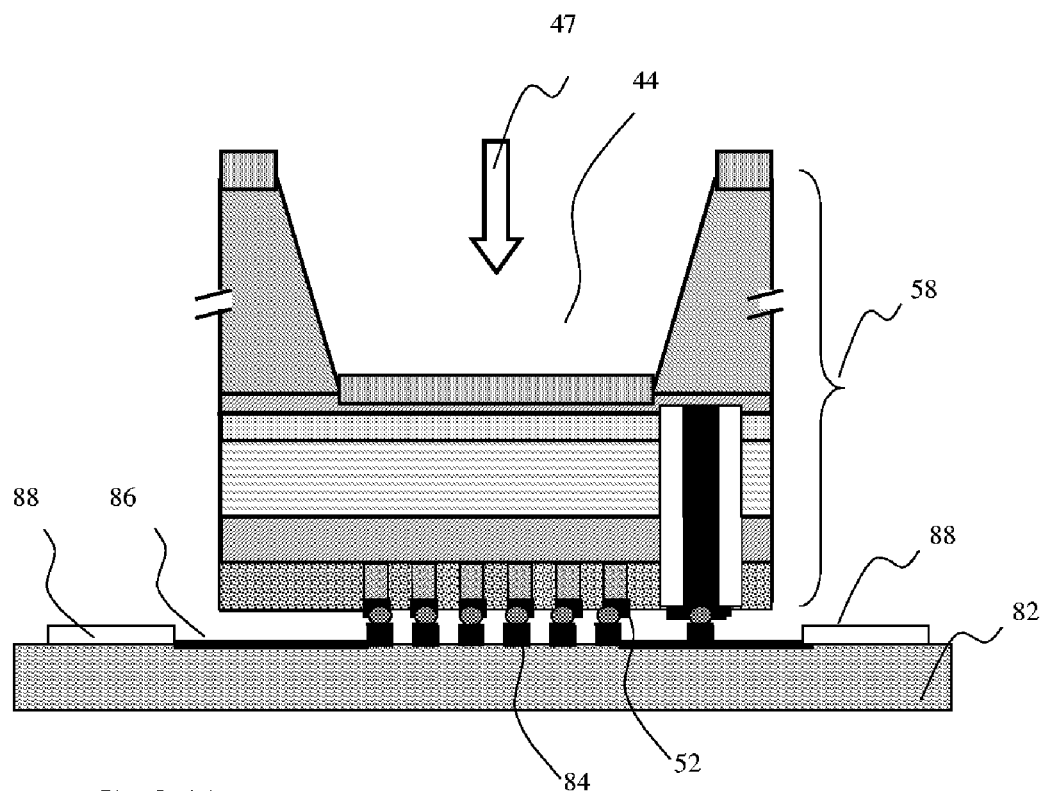
FIGS. 26A and 26B are the schematics showing the cross-sectional views of the bonding method for the back-illuminated photodiode (and array) to attach on the carrier having the logic circuit in the thirtieth embodiment in accordance to the present invention.
Figure 26B:
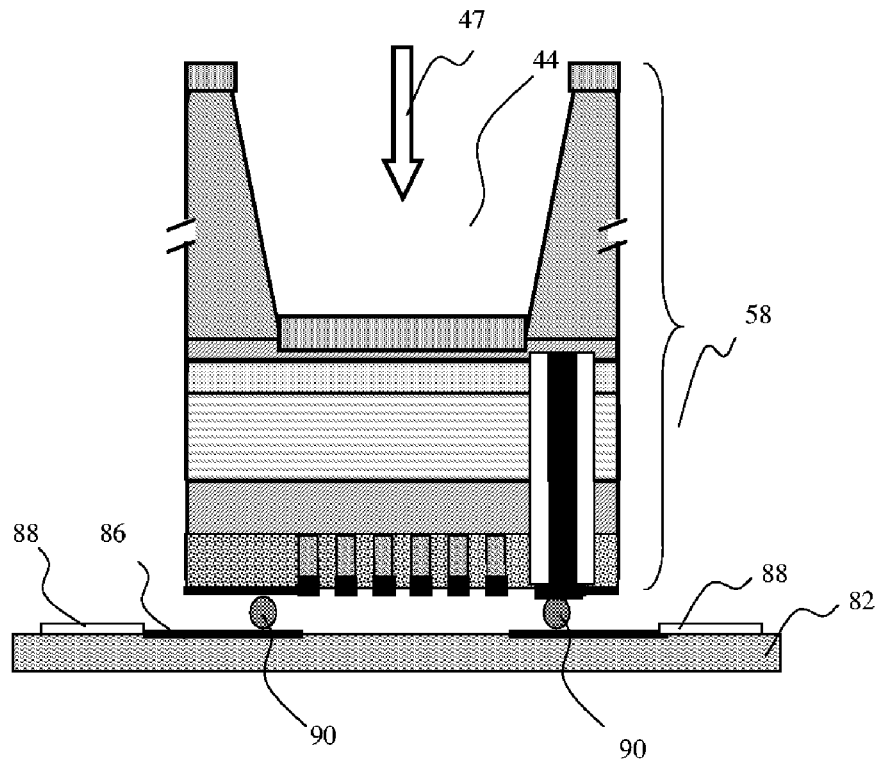

FIGS. 26A to 26B are the schematics showing the bonding technique photodiode array independently addressable in accordance to the present invention wherein the same parts are represented by the same numerals so that repeated explanation is omitted here. The detector array 58 is upside down bonded on the carrier (or board) 82 by the standard flip-chip technique or equivalent convenient to bonding. The carrier 82 could be the single layer or multiple layers and the tracing for the interconnection could be based on the structure of the detector. For example, if each pixel 52 is to be bonded directly to the carrier then the pads 84 are to be arranged based on the pitch of the pixel 52 (FIG. 26A). On the carrier, the interconnection 86 can be taken to the both side and bonding can be done (FIG. 26B). Requisite sized bumps 90 can be used for this purpose. The carrier 82 can have the capability to bond the detector array 58 and the integrated circuit 88. Sub-carrier (not shown here) can also be used only for bonding the detector array 58.

Figure 27A:
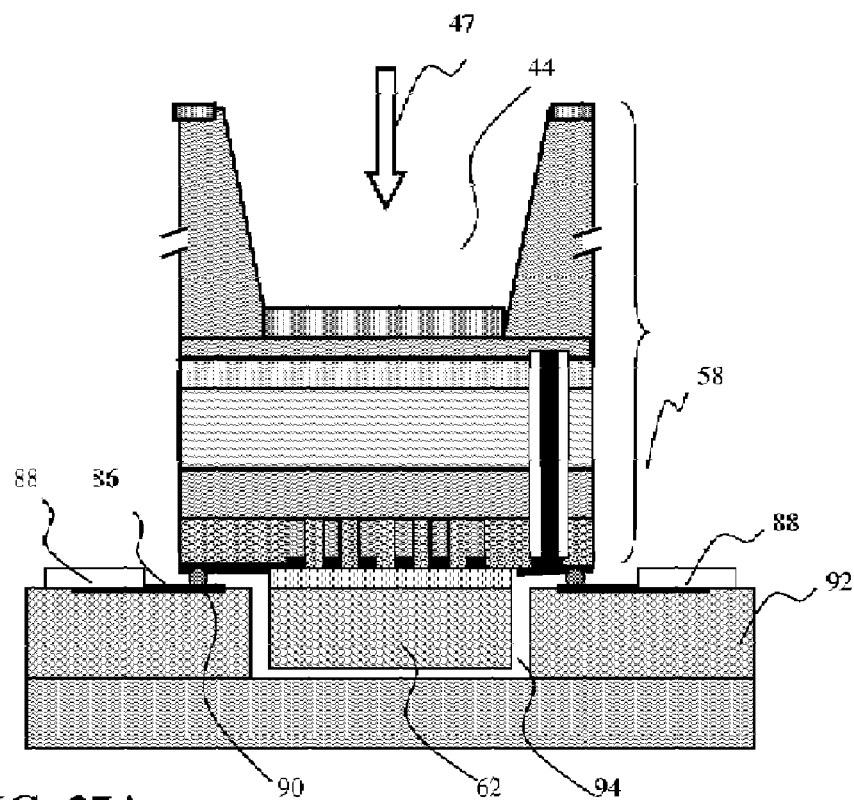
FIGS. 27A and 27B are the schematics showing the cross-sectional views of the bonding method for the back-illuminated photodiode (and array) having the quartz or semiconductor on the top in the thirty-first embodiment in accordance to the present invention.
Figure 27B:
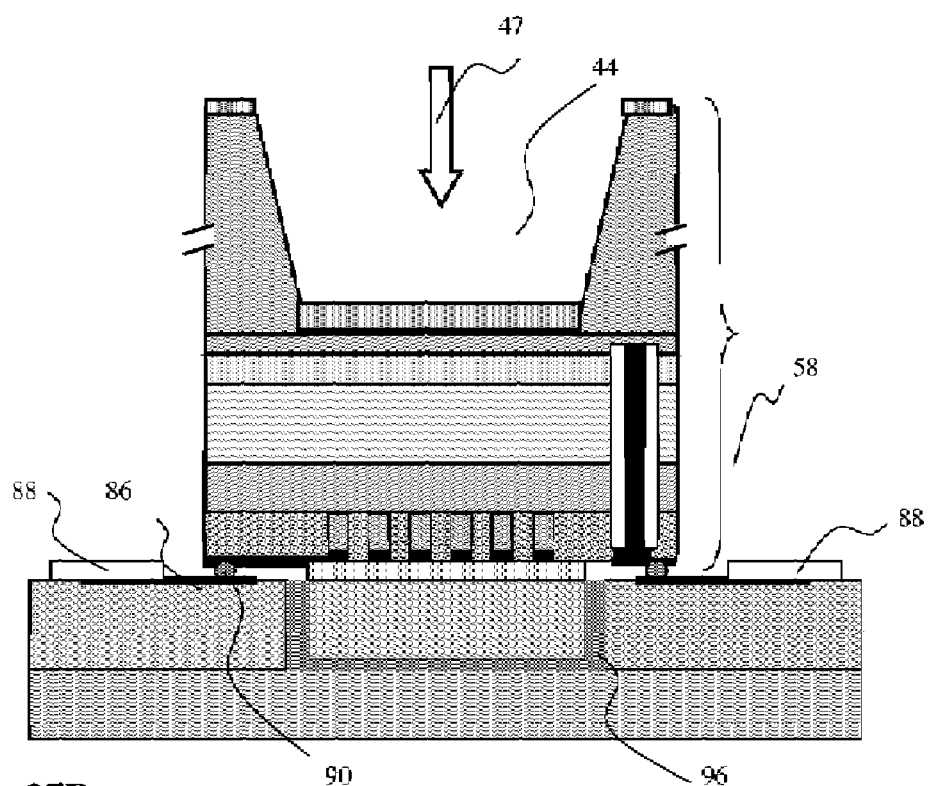

FIGS. 27A to 27B are the schematics showing the bonding technique of the photodiode array independently addressable in accordance to the present invention wherein the same parts are represented by the same numerals as shown in FIG. 26, so that repeated explanation is omitted here. In the preferred embodiment, the detector array having flat substrate attachment, carrier 92 which can be single layer or multiplayer having the groove just fit for the flat substrate 62 attached with detector 58. After bonding the detector 58 on the carrier 82, the gap 90 inside the groove can be filled with air or resin (insulating) material 96 which can absorb the heat and acts as the cushion for the whole detector.

In the preferred embodiment, top and bottom incident type photodiodes and their array are described. In the preferred embodiment, we have explained the fabrication process compatible for standard fabrication process. In the top-incident type photodiode array, the metal line can be fabricated to connect the each photodiode element with the outside pad using of the nano imprint technology or molding. This would help to increase the photodiode surface wider and/or to increase the fill-factor of the array. Increasing the fill-factor and also increasing the number of the elements in the array would help to increase the detection resolution. In the case of bottom incident type photodiode array, individually operated pixel can be bonded and in this case metal line is not required to draw from the photodiode surface. This increases the resolution of detection.

In the present invention, InGaAs is used the absorption layer and InP which block the absorption of the visible light and shorter wavelength are etched to extend the InGaAs absorption far below the shorter wavelength. To increase the spectrum bandwidth, various InGaAs contents may necessary. In the present invention, InP is used as the substrate, any kinds of substrate and the structure can be used, which has lattice match with InGaAs. III-V substrate such as GaAs, InSb, or GaN etc. can be used with proper matching layer with InGaAs layer, which is used as the absorption layer.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is our object to have the photodiode structure, which could provide the broad spectral detection capability ranges from <300 nm to as high as 1700 nm, high quantum efficiency >95%, and high frequency response (e.g. >10 GHz frequency response at 3 dB for the photodiode size of below 5 µm).

According to the present invention, it is our also object to provide the photodiode array of N×N elements which could also provide the broad spectral detection capability ranges from <300 nm to as high as 1700/2500 nm, high quantum efficiency >85%, and high frequency response (e.g. ~10 GHz frequency response at 3 dB for the photodiode size of 5 µm and the pitch of 10 µm). Better frequency response can also be expected if the metal line is designed as the transmission line of coplanar line or microstrip line types.

It is also our object to have the photodiode structure, which can provide stable spectral detection performance under wide range of temperature variation. Unlike a wide-wavelength wafer bonded photodiode, this present invented photodiode is capable of operating at any temperature with slight variation in the quantum efficiency for long wavelengths as the bandgap increases with decreasing temperature. At 5K, the bandgap of InGaAs increases to 0.81 eV (~1540 nm) while it is 0.75 eV (~1650 nm) at 300K. This will restrict the operating wavelengths to 1540 nm at 5K.

In the preferred embodiment, the photodiode array of N×N elements where each photodiode can be addressable independently is explained. Photodiode array having broad spectral detection ranges can also have the structure where the photodiode elements are connected by the two-axis electrode.

The present invention is expected to be found practically use in multiple purpose applications such as telecommunication, imaging (where CCD cannot be used), and also many sensing applications, and also in the applications including surveillance, satellite tracking, advanced lidar systems, etc. The most important advantage of this photodiode is that the performance will not be degraded under wide range of temperature variation, which eliminates the use of the temperature controller. Other advantage of this invention is that conventional fabrication technology can be used to fabricate the single photodiode or its array herein described.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An array device comprising:
   a common n-type ohmic contact;
   an n-type substrate etched out from the backside so as to avoid absorption of incident light from the backside into said substrate, and said substrate connected to the part of said n-type ohmic contact;
   at least one n-type buffer layer attached to said n-type substrate;
   at least one InGaAs absorption layer connected to said buffer layers, with an array of sections etched into said absorption layer so as to electrically isolate each said section;
   a spacer layer attached to each said section of said absorption layer so as to protect said absorption layer from diffused dopants;
   at least one doped p-type In-based ohmic contact layers covering each isolated section of the absorption layer, wherein said p-type In-based ohmic contact layers comprise $InAs_{0.6}P_{0.4}$ and/or highly-doped InP; and
   a plurality of p-type ohmic contacts, one on each said section of the absorption layer, connected to said p-type In-based ohmic contact layer,
   wherein each said p-type ohmic-contact to each section of said absorption layer forms an individual device and wherein the array device is illuminated from the backside of the substrate.

2. The array device of claim 1 wherein all n-type materials are replaced with p-type materials and all p-type materials are replaced with n-type materials.

* * * * *